US008254192B2

(12) United States Patent
Tsuchida

(10) Patent No.: US 8,254,192 B2
(45) Date of Patent: Aug. 28, 2012

(54) RESISTANCE CHANGE MEMORY

(75) Inventor: Kenji Tsuchida, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 188 days.

(21) Appl. No.: 12/563,559

(22) Filed: Sep. 21, 2009

(65) Prior Publication Data

US 2010/0157656 A1    Jun. 24, 2010

(30) Foreign Application Priority Data

Dec. 19, 2008    (JP) ................. 2008-324322

(51) Int. Cl.
*G11C 29/24* (2006.01)
*G11C 29/00* (2006.01)
*G11C 29/18* (2006.01)
*G11C 29/04* (2006.01)
*G11C 29/26* (2006.01)

(52) U.S. Cl. .......... 365/200; 365/230.03; 365/148; 365/158; 365/163

(58) Field of Classification Search ........ 365/200, 365/230.03, 148, 163, 158
See application file for complete search history.

(56) References Cited

U.S. PATENT DOCUMENTS

| 4,918,662 | A | * | 4/1990 | Kondo | 365/230.06 |
|---|---|---|---|---|---|
| 5,021,944 | A | * | 6/1991 | Sasaki et al. | 365/200 |
| 5,299,164 | A | * | 3/1994 | Takeuchi et al. | 365/201 |
| 6,496,430 | B2 | * | 12/2002 | Aikawa et al. | 365/200 |
| 2005/0283657 | A1 | * | 12/2005 | Nishihara | 714/8 |

FOREIGN PATENT DOCUMENTS

JP    2003-272397    9/2003

* cited by examiner

*Primary Examiner* — J. H. Hur

(74) *Attorney, Agent, or Firm* — Knobbe, Martens, Olson & Bear LLP

(57) ABSTRACT

A resistance change memory of an aspect of the present invention including memory cells including resistance change memory element, word lines connected to the memory cells, a row decoder which activates the word lines, redundant cells used instead of defective cells, a redundant word line connected to redundant cells, a redundant row decoder which activates the redundant word line, a control circuit in which defect address information indicating the word line connected to the defective cell is stored and which remedies the defective cell, and regions provided in a memory cell array and a redundant cell array and identified based on column address information, wherein the control circuit replaces a part of the word line connected to the defective cell with a part of the redundant word line in accordance with each of the regions, and allows the redundant row decoder to activate the replaced redundant word line.

18 Claims, 11 Drawing Sheets

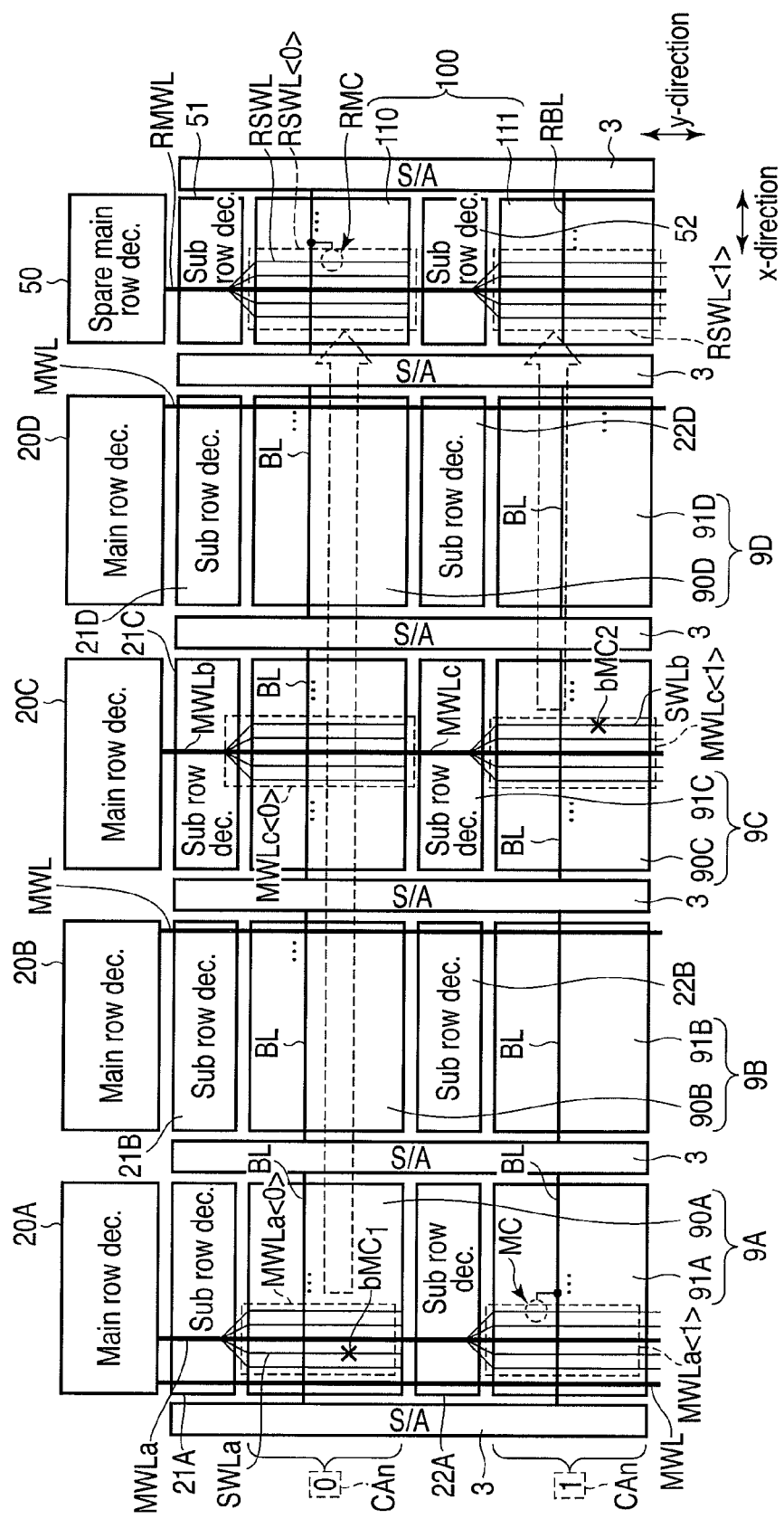
F I G. 10

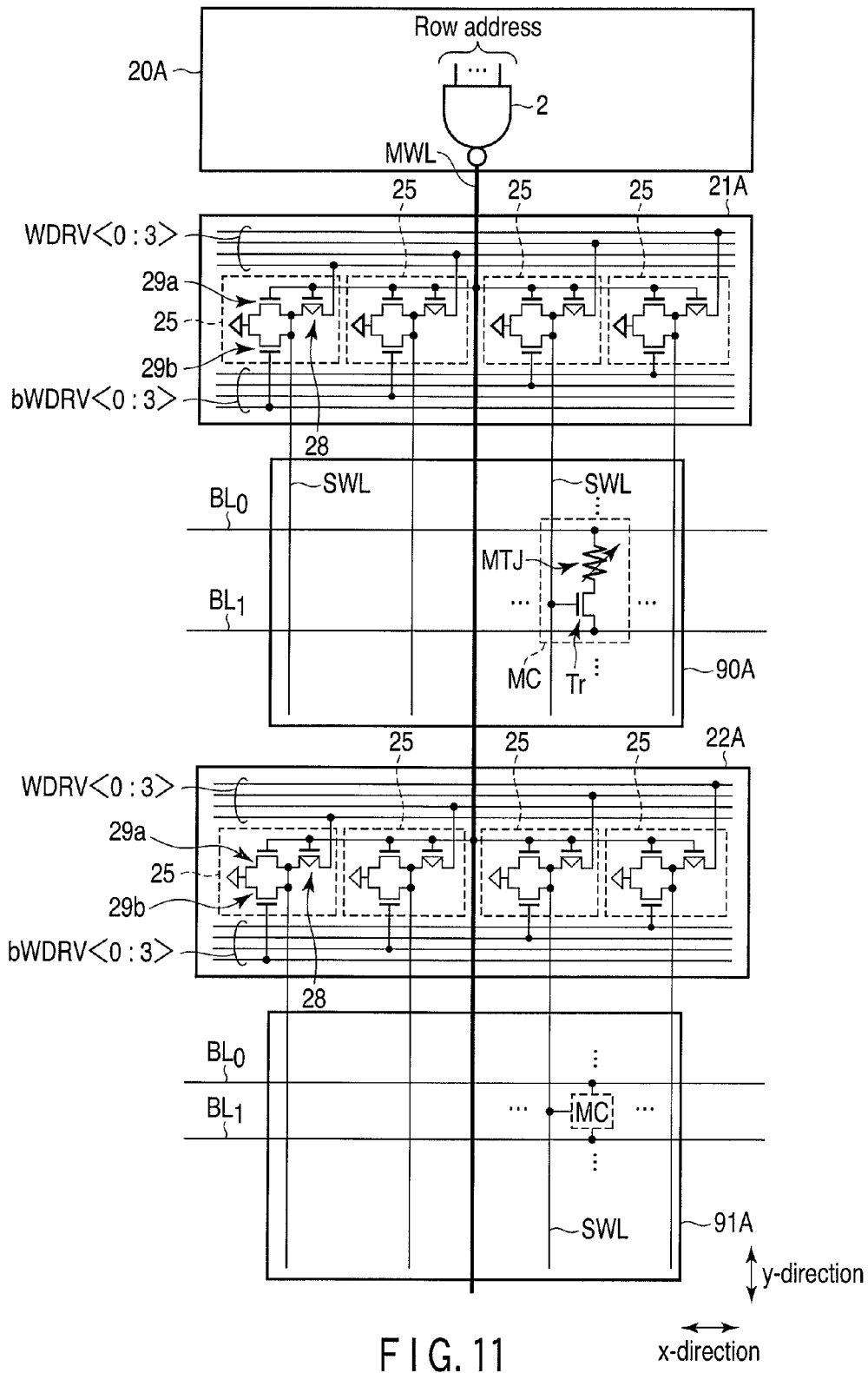
F I G. 11

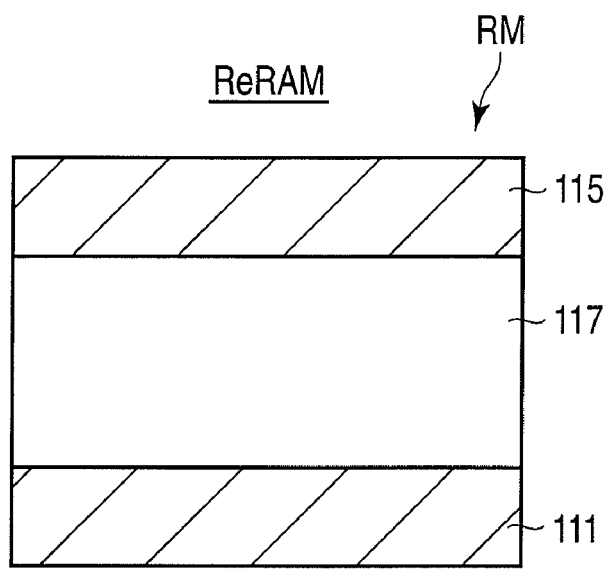
F I G. 12
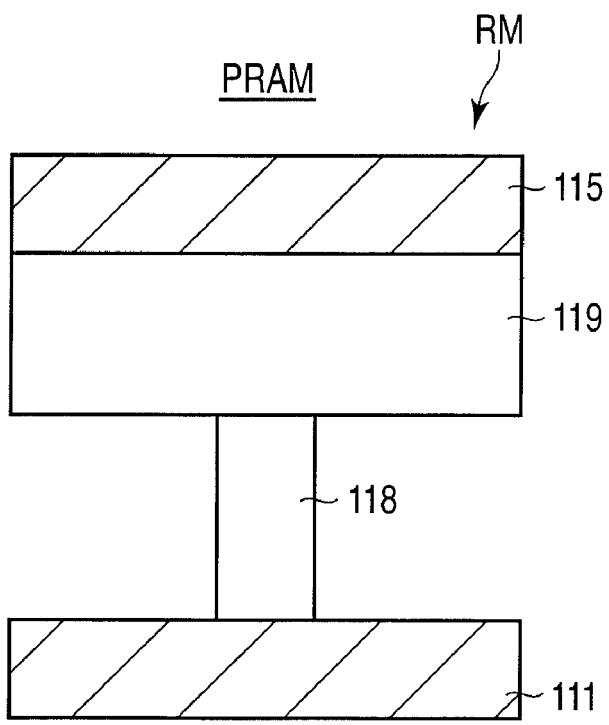
F I G. 13

RESISTANCE CHANGE MEMORY

CROSS-REFERENCE TO RELATED APPLICATIONS

This application is based upon and claims the benefit of priority from prior Japanese Patent Application No. 2008-324322, filed Dec. 19, 2008, the entire contents of which are incorporated herein by reference.

BACKGROUND OF THE INVENTION

1. Field of the Invention

The present invention relates to a resistance change memory. In particular, it relates to a defect remedy technology of a resistance change memory.

2. Description of the Related Art

In recent years, with the popularization of cellular phones and portable audio players, semiconductor memories have been mounted in such electronic devices.

In the semiconductor memory, a redundant cell array of an arbitrary scale is provided in the same chip as that of a memory cell array to remedy a defective cell in the memory cell array. For the semiconductor memory, there is employed a technique for remedying the defect of memory cells by using redundant cells in this redundant cell array instead of the accidentally generated defective cell (e.g., see Jpn. Pat. Appln. KOKAI Publication No. 2003-272397).

A defective cell remedy method usually remedies the defective cell every unit of a word line including the defective cell or a bit line including the defective cell with respect to a plurality of two-dimensionally arranged memory cells.

In the remedy method of the word line unit (hereinafter referred to as the row remedy method), a row address including the defective cell (hereinafter referred to as the defect address) is beforehand stored in a memory chip by use of fuses or the like. Then, when a row address input from the outside matches the stored defect address, the word line including the defective cell is deactivated, and the word line connected to the redundant cell (hereinafter referred to as the redundant word line) is activated to remedy the defective cell.

Meanwhile, in a volatile semiconductor memory such as a dynamic random access memory (DRAM), a refresh operation is necessary. Further, in the DRAM, the cycle number of the refresh operation is regulated by a memory capacity, and hence there is a restriction that the number of the memory cells as the targets of the refresh operation is determined in one cycle. Therefore, in the DRAM, it is impossible to partially activate one word line in the memory cell array owing to the specifications of the operation of the word line.

That is, in the DRAM, the matching state of the specifications of the refresh cycle with the operation has to be secured. Therefore, even if the number of the defective cell included in one word line is one, this word line is replaced with one redundant word line. In consequence, to remedy two defective cells included in different row addresses (word lines) of the memory cell array, two redundant word lines are necessary.

Thus, when the row remedy method is used for the DRAM, the redundant word lines as many as the word lines connected to the defective cells are necessary, regardless of the number of the defective cells connected to one word line.

In this case, when the number of the defective cells increases with the increase of the memory capacity and the miniaturization of the memory cells, and the number of the redundant word lines (the redundant cells) to be mounted also increase. That is, the defective cells increase with the capacity enlargement and the size miniaturization of the memory, but in such a case, the improvement of the remedy efficiency of the defective cells may cause the increase of a chip area and the increase of a manufacturing cost.

The semiconductor memory expected as a substitute for the DRAM, for example, no magnetoresistive random access memory (MRAM) require a refresh operation, and hence the above restriction on the refresh operation can be eliminated, and therefore there is desired the realization of the row remedy method having a higher remedy efficiency.

BRIEF SUMMARY OF THE INVENTION

A resistance change memory of an aspect of the present invention comprising: a memory cell array in which a plurality of memory cells including resistance change memory element are arranged in a matrix manner; a plurality of word lines connected to the plurality of memory cells, respectively, and extending in a first direction; a row decoder which is disposed near the memory cell array and which activates each of the word lines; a redundant cell array in which a plurality of redundant cells used instead of defective cells in the memory cell array are arranged; a redundant word line connected to the plurality of redundant cells, respectively, and extending in the first direction; a redundant row decoder which is disposed near the redundant cell array and which activates the redundant word line; a control circuit in which defect address information indicating the word line connected to the defective cell is stored and which remedies the defective cell in a case where input address information matches the defect address information; and at least two regions provided in the memory cell array and the redundant cell array, respectively, divided in the first direction, and identified based on column address information, wherein the control circuit replaces a part of the word line connected to the defective cell with a part of the redundant word line in accordance with each of the regions, and allows the redundant row decoder to activate the replaced redundant word line.

BRIEF DESCRIPTION OF THE SEVERAL VIEWS OF THE DRAWINGS

FIG. 10 is a block diagram showing the constitution of a resistance variable semiconductor memory according to a second embodiment;

FIG. 11 is an equivalent circuit diagram showing one example of the inner constitution of a memory cell array;

FIG. 12 is a diagram showing the structure of a resistance change memory element; and FIG. 13 is a diagram showing the structure of the resistance change memory element.

DETAILED DESCRIPTION OF THE INVENTION

Hereinafter, several modes for carrying out an example of the present invention will be described in detail with reference to the drawings.

First Embodiment

Hereinafter, a first embodiment of the present invention will be described with reference to FIGS. 1 to 8.

(1) Basic Constitution

The basic constitution of a resistance variable semiconductor memory according to a first embodiment of the present invention will be described with reference to FIGS. 1 and 2.

Figure 1:
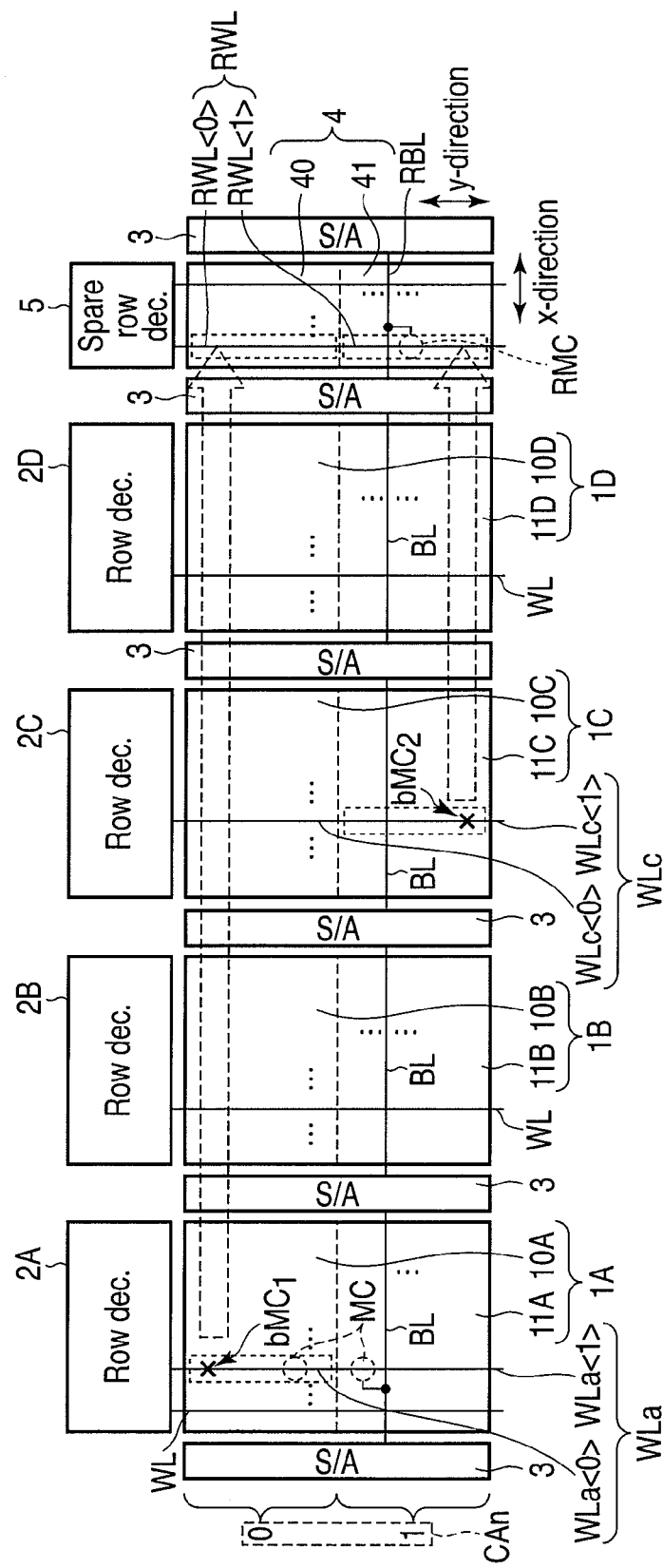
FIG. 1 is a block diagram showing a constitution of a resistance variable semiconductor memory according to a first embodiment.

FIG. 1 shows the constitution of memory cell arrays and circuits arranged near the arrays in the resistance variable semiconductor memory according to the present embodiment.

In an example shown in FIG. 1, four memory cell arrays 1A to 1D are provided in a chip. However, one memory cell array may be provided in one chip.

The memory cell arrays 1A to 1D include a plurality of memory cells MC using resistance change memory elements. The plurality of memory cells MC are arrayed in the memory cell arrays 1A to 1D.

In the memory cell arrays 1A to 1D, a plurality of word lines WL and a plurality of bit lines BL are provided. In FIG. 1, the word lines WL extend in, for example, a y-direction (a first direction), and the bit lines BL extend in, for example, an x-direction (a second direction). One word line WL is connected to the plurality of memory cells MC arranged in the y-direction. To one bit line BL, the plurality of memory cells MC arranged in the x-direction are connected in common. In the present embodiment, the plurality of memory cells connected in common to the one word line WL will also be referred to as a memory cell group. The specific example of the inner constitution of the memory cell arrays 1A to 1D will be described later.

The positions of the respective memory cells MC in the memory cell arrays 1A to 1D are indicated by row address information and column address information included in address information input into a chip. All bits ($=2^i$ bits) included in the row address information indicate one word line, and all bits ($=2^j$ bits) included in the column address information indicate one bit line BL.

Row decoders 2A to 2D are arranged adjacent to the memory cell arrays 1A to 1D in the y-direction, respectively. The row decoders 2A to 2D are provided to correspond to the memory cell arrays 1A to 1D, respectively. The row decoders 2A to 2D select and activate the word line WL based on the address information input from the outside.

Moreover, sense amplifiers 3 are arranged adjacent to the memory cell arrays 1A to 1D in the x-direction, respectively. Each sense amplifier 3 amplifies a signal (data) read from the selected memory cell to the bit line BL based on the address information, to detect the signal.

In the example shown in FIG. 1, the sense amplifiers 3 are arranged at both ends of each of the memory cell arrays 1A to 1D in the x-direction, and one memory cell array is connected to two sense amplifiers 3. In consequence, the data stored in the memory cells can be read from both the ends of the memory cell array. In this case, the sense amplifier 3 disposed between two memory cell arrays is used in common by the two memory cell arrays.

A redundant cell array 4 is provided adjacent to the memory cell array 1D via the sense amplifier 3 in the x-direction. In the redundant cell array 4, a plurality of redundant cells RMC used for remedying defective cells are provided. Moreover, in the redundant cell array, a redundant word line RWL extending in the y-direction and a redundant bit line RBL extending in the x-direction are provided.

The redundant cells RMC have a constitution similar to that of the memory cells MC. The redundant cells RMC are connected to the redundant word lines RWL in the same manner as in a connection relationship between the memory cells MC and the word lines WL. Moreover, the redundant cells RMC are connected to the redundant bit lines BL in the same manner as in a connection relationship between the memory cells MC and the bit lines BL. Note that the number of the redundant cells RMC connected to one redundant word line RWL is the same as that of the memory cells MC connected to one word line WL.

The redundant word line RWL is connected to a spare row decoder 5.

The spare row decoder 5 is disposed adjacent to the redundant cell array 4 in the y-direction. The spare row decoders 5 activate the redundant word line RWL in a case where the redundant cells are used instead of the defective cells.

Two sense amplifiers 3 are provided at both ends of the redundant cell array 4 in the x-direction in the same manner as in the memory cell arrays 1A to 1D. Moreover, one of the sense amplifiers 3 is shared by the memory cell array 1D and the redundant cell array 4. The redundant bit line RBL is connected to the sense amplifier 3.

When defective cells $bMC_1$, $bMC_2$ are present in the memory cell arrays 1A to 1D, a control circuit described later logically replaces word lines WLa, WLc including the defective cells with the redundant word line RWL. In consequence, the defective cells $bMC_1$, $bMC_2$ are remedied. This will specifically be described as follows.

The address information of the defective cells (hereinafter referred to as the defect address information) is beforehand detected and stored in the control circuit of the chip in a chip test step.

Then, at the time of the writing or reading operation of the chip, when a address information is input, the input address information is compared with the defect address information stored in the chip by the control circuit. As the result of the comparison, in a case where the control circuit judges that the input address information matches the address information indicating the word lines WLa, WLc including the defective cells $bMC_1$, $bMC_2$ (cross marks in FIG. 1), the control circuit allows the spare row decoder 5 to activate the redundant word line RWL in the redundant cell array 4 instead of the word line including the defective cell.

Thus, to remedy the defective cells in the resistance variable semiconductor memory of the present embodiment, a row remedy method performed for each word line is employed.

In the resistance variable semiconductor memory of the present embodiment, to remedy the defective cells included in the memory cell arrays (replace the word lines), each of the memory cell arrays 1A to 1D are divided into two or more regions, and divided regions 10A to 10D, 11A to 11D are associated and controlled. FIG. 1 shows an example in which the memory cell arrays 1A to 1D are divided into two regions 10A to 10D, 11A to 11D.

In the present embodiment, the memory cell arrays 1A to 1D are divided into the plurality of logical regions 10A to 10D, 11A to 11D based on column address information CAn. Hereinafter, the divided logical regions will be referred to as the segments. The segments 10A to 10D, 11A to 11D are divided based on the column address information CAn. Therefore, the memory cell arrays 1A to 1D are regions divided in the extending direction of the word lines (the y-direction). Moreover, in one memory cell array, two segments are disposed adjacent to each other in the y-direction.

The segments 10A to 10D, 11A to 11D are identified based on, for example, an n-th bit CAn included in the column address information. For example, the identification of the segments is made by using one most or least significant bit of the column address information. In the present embodiment, there will be described an example in which the segments are identified by using the most significant bit of the column address information.

The first segments 10A to 10D and the second segments 11A to 11D are set in the respective memory cell arrays 1A to 1D. The first segments 10A to 10D are identified by the column address information CAn="0". The second segments 11A to 11D are identified by the column address information CAn="1".

Moreover, in the same manner as in the memory cell arrays 1A to 1D, two segments 40, 41 identified by the column address information CAn="0", "1" are set in the redundant cell array 4.

In the example shown in FIG. 1, since the segments are set based on the column address information CAn, the word lines WLa, WLc are logically divided into a part WLa<0> or WLc<0> disposed in the first segments 10A to 10D and a part WLa<1> or WLc<1> disposed in the second segments 11A to 11D.

Moreover, when the defective cells are remedied, each of the logically divided parts WLa<0>, WLc<0>, WLa<1> and WLc<1> is individually controlled as a remedy unit, and a part of the word line is replaced with a part of the redundant word line. In consequence, the defective cells in the memory cell arrays 1A to 1D are remedied.

For example, in the memory cell array 1A, the word line WLa includes the defective cell $bMC_1$. The defective cell $bMC_1$ is present in the segment 10A corresponding to the column address information CAn="0", and is connected to the part WLa<0> of the one word line WLa provided in the segment 10A.

In a case where the input address information (row/column address information) indicates the word line WLa connected to the defective cell and indicates the segment 10A in which the defective cell is present, the part (the first part) WLa<0> of the word line WLa disposed in the segment 10A is deactivated.

Moreover, in the redundant cell array 4, the part RWL<0> of one redundant word line RWL disposed in the segment 41 is activated by the spare row decoder 5 based on the column address information CAn="0" instead of the part WLa<0> of the word line WLa connected to the defective cell.

In consequence, the part WLa<0> of the word line WLa including the defective cell is replaced with the part RWL<0> of the redundant word line RWL. Therefore, the defective cell $bMC_1$ connected to the part WLa<0> of the word line WLa is remedied.

Moreover, in the segment 11A of the memory cell array 1A corresponding to the column address information CAn="1", no word line WLa include a defective cell. In this case, the part (the second part) WLa<1> of the word line WLa disposed in the segment 11A is not replaced with the part RWL<1> of the redundant word line RWL disposed in the segment 41. That is, in a case where in the address information input during the operation of the chip, the row address information indicates the word line WLa connected to the defective cell $bMC_1$ and the column address information CAn indicates the segment 11A of the word line WLa in which no defective cell is present, the word line WLa (the part WLa<1> of the word line WLa) is activated by the row decoder 2A based on the address information. Moreover, a normal memory cell connected to the part WLa<1> of the word line WLa is the target of an operation (an access) as usual.

The defective cell $bMC_2$ included in the memory cell array 1C is remedied by using the redundant cell in the redundant cell array 4 in the same manner as in the defective cell $bMC_1$ included in the memory cell array 1A.

That is, in the word line WLc connected to the defective cell $bMC_2$, the part WLc<1> of the word line WLc disposed in the segment 11C is replaced with the part RWL<1> of the redundant word line RWL disposed in the segment 41 based on the column address information CAn="1" included in the input address information. In consequence, the word line WLc is deactivated, and the redundant word line RWL is activated by the spare row decoder 5.

Moreover, no part WLc<0> of the word line WLc corresponding to the column address information CAn="0" include a defective cell. Therefore, when the row/column address information requiring the access (writing/reading) is input, the word line WLc is activated by the row decoder 2C as usual.

Furthermore, as described above, the redundant cell array 4 is also divided into two segments 40, 41, and controlled. Therefore, each of two parts RWL<0>, RWL<1> of one redundant word line RWL corresponding to the respective segments can be individually used for replacing the word line connected to the defective cell. That is, in a case where the segments in which the defective cells $bMC_1$, $bMC_2$ are present are different from each other, the defective cells included in two word lines can be remedied by using one redundant word line RWL. Therefore, the freedom degree (flexibility) of the remedy of the defective cell by use of one redundant word line is "2". For example, when the redundant cell array 4 has eight redundant word lines and each of the memory cell arrays 1A to 1D and the redundant cell array 4 has two segments 10A to lop, 40, 11A to 11D, 41 set based on the column address information CAn for one bit as shown in FIG. 1, the freedom degree of the remedy of the semiconductor memory shown in FIG. 1 is "16".

Thus, the memory cell arrays 1A to 1D are divided into the plurality of segments 10A to 11D based on the column address information CAn in the row remedy method, whereby the remedy efficiency of the defective cells can be improved.

Moreover, the segments are set and identified in the respective memory cell arrays 1A to 1D based on the column address information CAn as described above, in the present embodiment. In consequence, the number of the segments can be regulated in accordance with the number of the bits included in the column address information, and hence three or more segments can be set with respect to one memory cell array.

Figure 2:
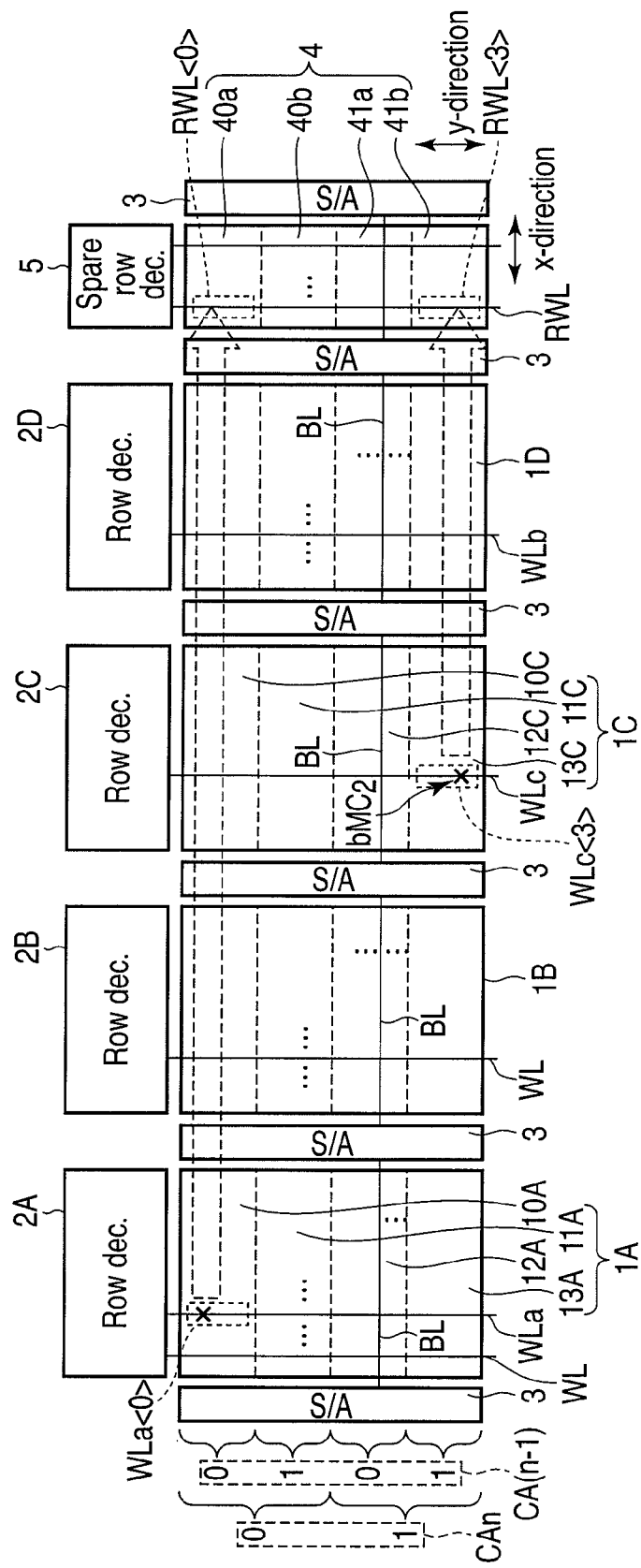
FIG. 2 is a diagram for explaining an application example of the first embodiment.

In an example shown in FIG. 2, four segments 10A to 13A, 10C to 13C are set in one of memory cell arrays 1A to 1C by use of column address information CAn, CA(n-1) for two bits. In this constitution, each of one word line WL and one redundant word line RWL is logically divided into four parts and their parts is individually controlled at the time of the remedy of defective cells.

Moreover, when the defective cells are access targets, divided parts WLa<0> and RWL<0> of the word line and the redundant word line are replaced as remedy units, respectively. In consequence, the redundant word line is activated, and a defective cell included in a part WLa<0> of a word line WLa is remedied. Similarly, a part WLc<3> of a word line WLc is replaced with a part RWL<3> of the redundant word line.

Furthermore, in the segments 11A to 13A, 10C to 12C which do not include any defective cell, the parts of the word lines WLa, WLc in the segments 11A to 13A, 10C to 12C are used as the access targets, and activated by row decoders 2A, 2C.

Note that when all the bits of the column address information are used, the memory cell arrays 1A to 1D have the segments as many as bit lines, and the defective cells can be remedied for each memory cell (each defective cell) as a unit.

Thus, the number of the segments set in the memory cell array, that is, the number of the divided word lines can be increased to improve the freedom degree of the remedy of the defective cells. Note that the memory cell arrays 1A to 1D are preferably divided into two to 16 segments.

Furthermore, in the present embodiment, the column address information is used for setting and identifying the segments. Therefore, to set and identify the segments, a new signal does not have to be added to the control signal of a chip, and no complicated circuit has to be used. In consequence, the remedy efficiency of the defective cells can be improved by a simple constitution.

As described above, in the first embodiment of the present invention, each of the memory cell arrays 1A to 1D is logically divided into two or more regions (segments) in the extending direction of the word lines WL (the y-direction) based on the column address information CAn. When the defective cells are remedied, the word line including the defective cell is controlled for each part of the line disposed in the segment based on the column address information. Then, in the word line including the defective cell, the part (the memory cell group) corresponding to the segment including the defective cell is replaced with the part of the redundant word line corresponding to the segment. In consequence, the defective cell is remedied. Moreover, in the word line including the defective cell, a part (the memory cell group) of the word line corresponding to the segment which does not include any defective cell is used as usual.

Thus, the parts of one word line disposed in the different segments, respectively, are independently treated as the units of the remedy.

Therefore, when the defective cells are remedied as in the present embodiment, the freedom degree of the remedy increases without increasing the number of the redundant word lines mounted in the chip, in other words, without involving the increase of the number of the redundant cells or the increase of the occupying area of the redundant cell array.

In consequence, according to the resistance variable semiconductor memory of the first embodiment of the present invention, the freedom degree of the remedy of the defective cells can be improved, and the remedy efficiency of the defective cells in the memory cell arrays can be improved.

(2) Specific Example
(a) Circuit Constitution

A more specific constitution example of the resistance variable semiconductor memory according to the present embodiment will be described with reference to FIGS. 3 to 7.

Figure 3:
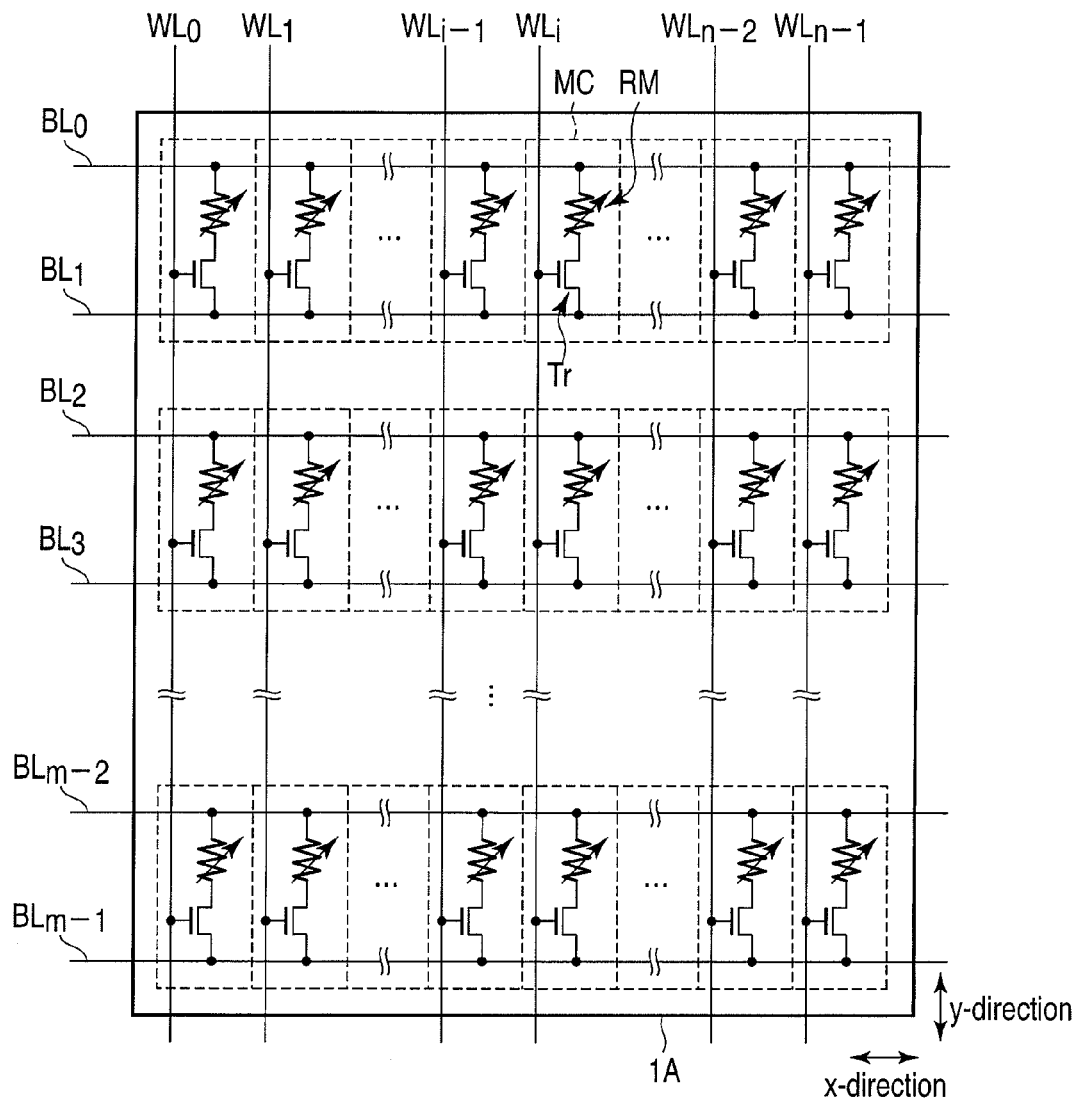
FIG. 3 is an equivalent circuit diagram showing one example of the inner constitution of a memory cell array.

FIG. 3 shows one example of the inner constitution of one memory cell array 1A.

As shown in FIG. 3, a plurality of memory cells MC are arrayed along an x-direction and a y-direction in the memory cell array 1A. Moreover, as shown in FIG. 3, in the memory cell array 1A, a plurality of bit lines $BL_0$ to $BL_{m-1}$ and a plurality of word lines $WL_0$ to $WL_{n-1}$ are provided.

The plurality of bit lines $BL_0$ to $BL_{m-1}$ extend along the x-direction, and are arranged side by side in the y-direction. For example, as in the bit lines $BL_0$ and $BL_1$, two bit lines connected to one end and the other end of the memory cell MC form a pair of bit lines. The plurality of word lines $WL_0$ to $WL_{n-1}$ extend along the y-direction, and are arranged side by side in the x-direction.

A plurality of memory cells MC arranged along the x-direction are connected in common to the pair of bit lines. The plurality of memory cells MC arranged along the y-direction are connected in common to one word line.

Each memory cell MC includes, for example, one resistance change memory element RM and one field effect transistor Tr.

The resistance change memory element RM in each memory cell MC performs the storage of data. When the resistance variable semiconductor memory of the present embodiment is, for example, a magnetoresistive random access memory (MRAM), the resistance change memory element RM is a magnetoresistive effect element. The magnetoresistive effect element RM stores the data in a nonvolatile manner.

The magnetoresistive effect element is, for example, an MTJ element having magnetic tunnel junction.

Figure 4:
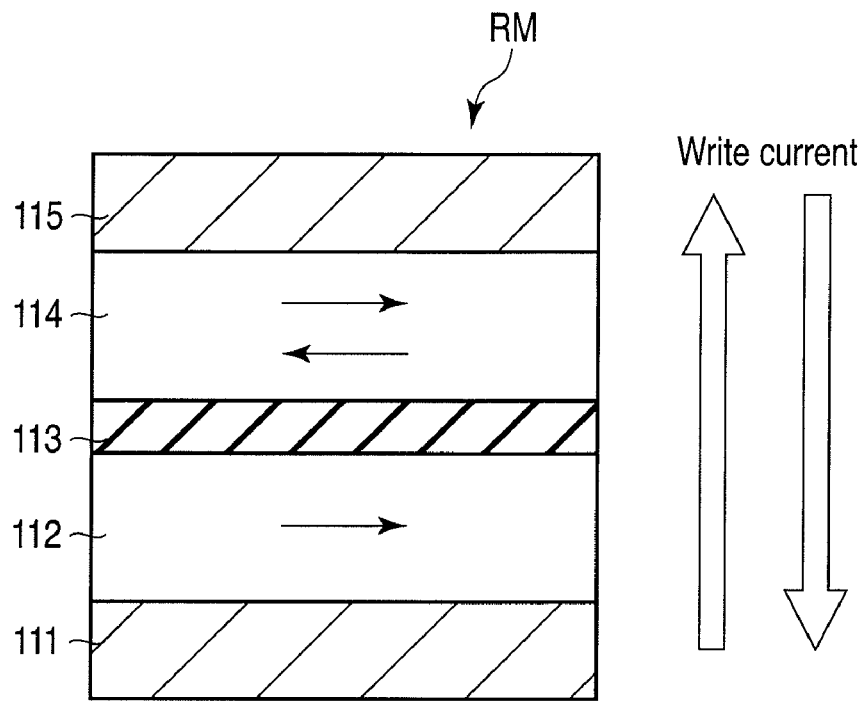
FIG. 4 is a diagram showing the structure of a resistance change memory element.

As shown in, for example, FIG. 4, the basic structure of the magnetoresistive effect element RM is constituted of a first magnetic layer (a reference layer) 112 having an invariant magnetizing direction, a second magnetic layer (a storage layer) 114 having a variable magnetizing direction, and an intermediate layer 113 sandwiched between the first magnetic layer and the second magnetic layer. Moreover, the magnetic layer 112 is provided on a lower electrode 111. Furthermore, on the magnetic layer 114, an upper electrode 115 is provided.

The field effect transistor Tr in each memory cell MC functions as a switch element for the resistance change memory element RM. Hereinafter, the field effect transistor Tr provided in the memory cell MC will be referred to as the select transistor Tr.

One end of the magnetoresistive effect element RM is connected to the one bit line $BL_0$ of the pair of bit lines.

One end of a current path of the select transistor Tr is connected to the other end of the resistance change memory element (the magnetoresistive effect element) RM. The other end of the current path of the select transistor Tr is connected to the other bit line $BL_1$ of the pair of bit lines. The word line $WL_i$ is connected to a control terminal (gate electrode) of the select transistor Tr.

In the MRAM, each magnetoresistive effect element RM can take two constant states (resistance states) in which the magnetizing directions of the two magnetic layers are parallel or anti-parallel. One of the states corresponds to "0" data, and the other state corresponds to "1" data, whereby the magnetoresistive effect element RM stores binary data. The writing of the data in the magnetoresistive effect element RM is executed by supplying, for example, a writing current (hereinafter also referred to also as the spin polarization current) of spin-polarized electrons between the pair of bit lines $BL_0$ and $BL_1$. The size of the spin polarization current is not less than a current value required for reversing the magnetizing direction of the storage layer. At the time of the writing of the data, the spin polarization current is supplied from the one end to the other end of the magnetoresistive effect element, or from the other end to the one end of the magnetoresistive effect element in accordance with the written data. Consequently, in the magnetoresistive effect element RM, the relative magnetizing directions of the storage layer and the reference layer are changed, the resistance value of the magnetoresistive effect element RM change.

Moreover, the reading of the data from the magnetoresistive effect element RM is executed by supplying a current (the reading current) smaller than the spin polarization current between the pair of bit lines $BL_0$ and $BL_1$. When the reading current is supplied to the magnetoresistive effect element RM, the potential of the bit line $BL_0$ or $BL_1$ varies in accordance with the resistance value (the data) corresponding to the constant state (parallel/anti-parallel) of the element RM. This potential variance is detected to read the data.

When the memory cell array 1A is the constituent array of the MRAM as in the present embodiment, a circuit (not shown) for supplying the writing current and the reading current between the pair of bit lines $BL_0$ and $BL_1$ is provided in the vicinity of the memory cell array 1A.

In the present embodiment, there is no special restriction on the constitution of the magnetoresistive effect element RM as the resistance change memory element. The magnetoresistive effect element may be of, for example, an in-plane magnetization type in which the magnetizing directions of the first and second magnetic layers are parallel directions with respect to a film surface, or may be of a vertical magnetization type in which the magnetizing directions of the magnetic layers are vertical directions with respect to the film surface. The structure of the magnetoresistive effect element RM may be a single junction structure having one magnetic tunnel junction (tunnel barrier layer), or a double junction structure having two magnetic tunnel junction (tunnel barrier layers).

Figure 5:
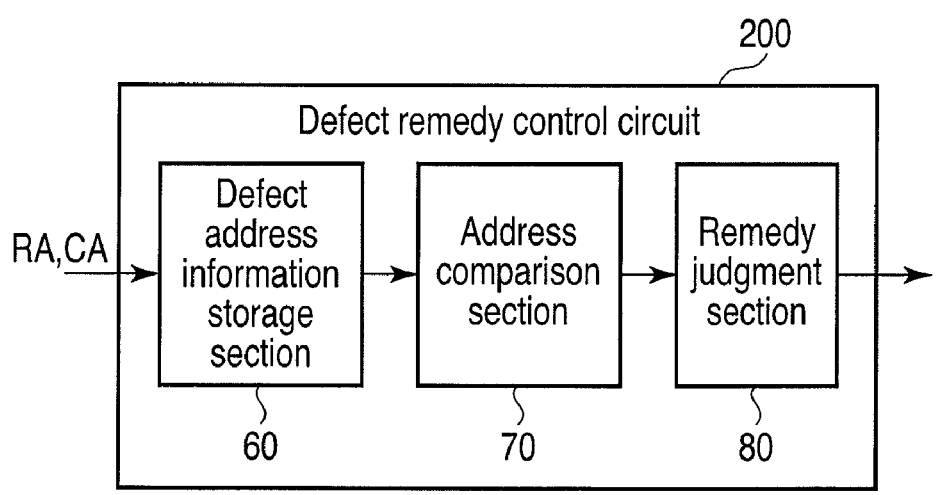
FIG. 5 is a block diagram for explaining a constitution example of a circuit for remedying defective cells.

FIG. 5 shows a constitution example of a control circuit 200 for remedying defective cells present in segments set in the memory cell array. In the present embodiment, the control circuit shown in FIG. 5 will be referred to as the defect remedy control circuit 200. The defect remedy control circuit 200 is provided in, for example, the same chip as that of the memory cell arrays 1A to 1D, the redundant cell array 4 and the like shown in FIG. 1.

The defect remedy control circuit 200 includes, for example, a defect address information storage section 60, an address comparison section 70 and a remedy judgment section 80. The defect remedy control circuit 200 controls the replacement of the word line with the redundant word line, when the address of the word line connected to the defective cell is input.

The defect address information storage section 60 stores the address information of the word line (a row) and the segment (a column) including the defective cells. Hereinafter, the address information of the defective cell in the present embodiment will be referred to as defect address information. The defect address information storage section 60 has, for example, a fuse or a read only memory (ROM) as a storage element for storing the defect address information. Note that in the present embodiment, a nonvolatile resistance change memory element is used, and therefore the defect address information may be stored in a memory region having the same constitution as that of the memory cell array.

The address comparison section 70 compares the defect address information read from the defect address information storage section 60 with the address information (hereinafter referred to as the selection address information) input into the chip to judge whether or not the defect address information matches the selection address information. Note that in the present embodiment, as to the selection address information, the address information indicating the row is referred to as the selection row address information, and the address information indicating the column is referred to as the selection column address information.

The remedy judgment section 80 judges whether or not to remedy the defective cell (replace the word line) by use of the result of the comparison between the defect address information and the selection address information.

According to such a constitution, the defect remedy control circuit 200 regards the part of the word line of the segment in which the defective cell is present in the one word line including the defective cell as the unit of the remedy to control the replacement of the part of the word line including the defective cell with the part of the redundant word line.

One example of the inner constitution of the defect remedy control circuit 200 will be described with reference to FIGS. 6 to 8.

Figure 6:
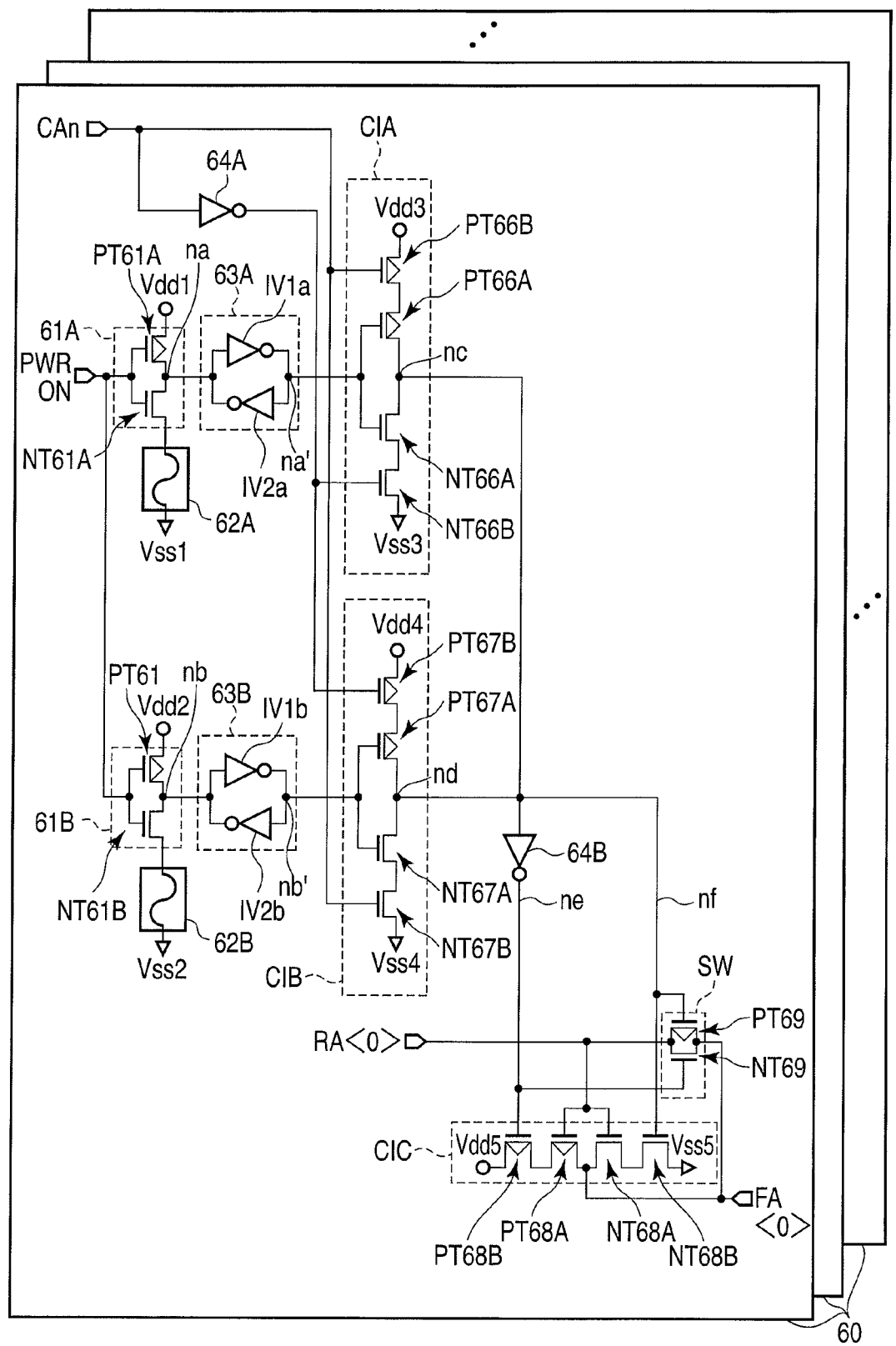
FIG. 6 is an equivalent circuit diagram showing one example of the circuit for remedying the defective cells.

FIG. 6 shows one example of the inner constitution of the defect address information storage section 60. When the address information of the word line in each memory cell array of the chip is represented by 11 bits, 11 defect address information storage sections 60 are provided to correspond to pieces of the row address information for one bit, respectively. The input row address information is input bit by bit into each of the storage sections 60 so as to correspond to the digit of each bit. That is, the 11 defect address information storage sections 60 form one set (group) to indicate the address information of one word line including the defective cell. For example, when the freedom degree of the remedy of the defective cell in a certain chip is 16, 16 sets of defect address information storage sections are mounted. Hereinafter, the plurality of defect address information storage sections 60 corresponding to the address information of one word line including the defective cell will be referred to as the defect address information storage section group.

In the example shown in FIG. 6, the defect address information storage section 60 stores the defect address information of the memory cell array by use of fuses 62A, 62B. The fuses 62A, 62B store the defect address information, for example, depending on whether or not the fuses 62A, 62B are fused by laser.

The one defect address information storage section 60 has the two fuses 62A, 62B and a circuit group which controls the reading of the defect address information indicated by the fuses 62A, 62B.

The address information of the word line connected to the defective cell is stored in the defect address information storage section 60, when the fuses 62A, 62B are fused by the laser, a high voltage or the like.

When the row address information of the defective cell is, for example, "0", the fuses 62A, 62B are not fused. On the other hand, when the row address information of the defective cell (hereinafter referred to as the defect row address information) is "1", the fuses 62A, 62B are fused. That is, when all the bits of the defect row address information are "0", the fuses of the plurality of defect address information storage sections 60 for storing the address information are not fused. On the other hand, when all the bits of the defect row address information are "1", the fuses of the defect address information storage sections 60 for storing the address information are fused.

In the present embodiment, as shown in FIG. 6, two fuses 62A, 62B are provided with respect to the row address information for one bit ("0", "1"), that is, one defect address information storage section 60. This corresponds to a case where as shown in FIG. 1, two segments 10A, 11A are provided for one memory cell array 1A based on the column address information CAn for one bit. For example, the fuse 62A corresponds to the column address information CAn of "0", and the fuse 62B corresponds to the column address information CAn of "1".

In this case, when the defect address information stored in one defect address information storage section 60 indicates the row address information of "1" and the column address information of "0", the fuse 62A is fused. Moreover, when, the defect address information indicates the row address information of "1" and the column address information of "1", the fuse 62B is fused. Note that when the defect address information indicates the row address information of "0", either of the fuses 62A, 62B corresponding to the column address information CAn of "0" and "1" is not fused.

The fuses 62A, 62B are connected to CMOS inverters 61A, 61B on the side of a ground terminal.

Each of the CMOS inverters 61A, 61B is constituted of one P-type metal-insulator-semiconductor (MIS) transistor and one N-type MIS transistor.

Gates of P-type MIS transistors PT61A, PT61B and gates of N-type MIS transistors NT61A, NT61B are connected in parallel to form input nodes, respectively.

One end of a current path of each of the P-type MIS transistors PT61A, PT61B is connected to a power supply terminal Vdd1, Vdd2, respectively. The other end of the current path of each of the P-type MIS transistors PT61A, PT61B is connected to one end of a current path of each of the N-type MIS transistors NT61A, NT61B, respectively. Connection points between the P-type MIS transistors PT61A, PT61B and the N-type MIS transistors NT61A, NT61B are output nodes na, nb. The other end of the current path of each of the N-type MIS transistors NT61A, NT61B is connected to one end of each of the fuses 62A, 62B, respectively. Then, the other end of each of the fuses 62A, 62B is connected to the ground terminal Vss1, Vss2, respectively.

When the fuses 62A, 62B are fused, the output nodes na, nb are approximately charged to power supply potentials Vdd1, Vdd2, and potentials of the output nodes na, nb indicate a "high (H)" level.

When the fuses 62A, 62B are not fused, the power supply potentials Vdd1, Vdd2 are discharged to ground potentials Vss1, Vss2 through the fuses 62A, 62B, and hence and potentials of the output nodes na, nb indicate a "low (L)" level.

Into the input nodes of the two CMOS inverters 61A, 61B, a chip startup signal PWRON is input in common.

The output node na of the CMOS inverter 61A is connected to an input node of a latch circuit 63A. Moreover, the output node nb of the CMOS inverter 61B is connected to an input node of a latch circuit 63B.

Each of the latch circuits 63A, 63B is constituted of, for example, two inverters (NOT gates) IV1a, IV2a or IV1b, IV2b. Output nodes na', nb' of the latch circuits 63A, 63B hold reverse signals of signals in the output nodes na, nb of the CMOS inverters 61A, 61B.

The output nodes na', nb' of the latch circuits 63A, 63B are connected to input nodes of clocked inverters CIA, CIB.

The clocked inverters CIA, CIB are provided for the two fuses 62A, 62B, respectively. The clocked inverters CIA, CIB use a column address signal CAn as a control signal. Then, based on the column address information CAn for one bit of the memory cell as the access target, one of the two clocked inverters CIA, CIB is activated. In consequence, the signal corresponding to the state of one of the fuses is selectively output.

Each of the clocked inverters CIA, CIB includes two P-channel type MIS transistors PT66A and PT66B, PT67A and PT67B, and two N-channel type MIS transistors NT66A and NT66B, NT67A and NT67B.

In the clocked inverter CIA corresponding to the fuse 62A, the P-type MIS transistor PT66A and the N-type MIS transistor NT66A comprise one CMOS inverter. Moreover, with respect to this CMOS inverter, the P-type MIS transistor PT66B and the N-type MIS transistor NT66B function as transfer transistors.

Between the P-type MIS transistor PT66A and a power supply terminal Vdd3, the P-type MIS transistor PT66B is provided. One end of a current path of the P-type MIS transistor PT66B is connected to the power supply terminal Vdd3, and the other end of the current path of the P-type MIS transistor PT66B is connected in series to one end (source end) of a current path of the P-type MIS transistor PT66A.

Moreover, between the N-type MIS transistor NT66A and a ground terminal Vss3, the N-type MIS transistor NT66B is provided. One end of a current path of the N-type MIS transistor NT66B is connected to the ground terminal Vss3, and the other end of the current path of the N-type MIS transistor NT66B is connected in series to one end (source end) of the current path of the N-type MIS transistor NT66A.

According to a constitution substantially similar to the clocked inverter CIA in the clocked inverter CIB corresponding to the fuse 62B, the two P-type MIS transistors PT67A, PT67B are connected to the two N-type MIS transistors NT67A, NT67B.

That is, the P-type MIS transistor PT67A and the N-type MIS transistor NT67A include one CMOS inverter. Moreover, between the P-type MIS transistor PT67A of the CMOS inverter and a power supply terminal Vdd4, the P-type MIS transistor PT67B which functions as a transfer transistor is connected. Moreover, between the N-type MIS transistor NT67A of the CMOS inverter and a ground terminal Vss4, the N-type MIS transistor NT67B which functions as a transfer transistor is connected.

Here, in the two clocked inverters CIA, CIB, the column address information CAn is input into gates of the MIS transistors PT66B, NT66B, PT67B and NT67B which function as transfer transistors. The operations of the inverters are controlled in accordance with the signal level ("L(0)", "H(1)") of this column address information CAn so that one of the clocked inverters CIA, CIB is selectively activated. This will specifically be described as follows.

In the clocked inverter CIA corresponding to the fuse 62A, an in-phase signal of the column address information CAn is input into the gate of the P-type MIS transistor PT66B, and a reverse signal of the column address information CAn is input into the gate of the N-type MIS transistor NT66B through an inverter (the NOT gate) 64A.

On the other hand, in the clocked inverter CIB corresponding to the fuse 62B, the reverse signal of the column address information CAn is input into the gate of the P-type MIS transistor PT67B through the inverter 64A, and the in-phase signal of the column address information CAn is input into the gate of the N-type MIS transistor NT67B.

When the column address information CAn is "0" (=the "L" level), the transistors PT66B, NT66B as the transfer transistors of the clocked inverter CIA turn on. Therefore, the clocked inverter CIA turns on, and the input signal can be transferred. On the other hand, in the clocked inverter CIB, the transistors PT67B, NT67B as the transfer transistors turn off, and hence no clocked inverter CIB output signal.

Moreover, when the column address information CAn is "1" (=the "H" level), the transistors PT67B, NT67B as the transfer transistors of the clocked inverter CIB turn on. Therefore, the clocked inverter CIB turns on, and the input signal can be transferred. On the other hand, in the clocked inverter CIA, the transistors PT67B, NT67B as the transfer transistors turn off, and hence no clocked inverter CIA output signal.

In consequence, one piece (1 bit) of the defect address information is selected from the pieces of the defect address information stored in the two fuses 62A, 62B, respectively, by the two clocked inverters CIA, CIB which operate based on the logical state ("0" or "1") of the column address information CAn. Then, one selected defect address signal is output from an output node nc or nd of one of the clocked inverters CIA, CIB capable of transferring the signal to a node ne or nf. Thus, the logical state of the column address information CAn is used, that is, the information of the segment in which the defective cell is present is reflected at the time of the reading of the defect address information, whereby the defect address information storage section 60 shown in FIG. 6 can read the address information of the word line including the defective cell.

Moreover, to access the memory cell corresponding to the input address information in consideration of the remedy of the defective cell, the input selection address information needs to be compared with the defect address information. Therefore, signals (the defect address information for one bit) output to the nodes (liens) ne and of are combined with row address information RA<0> of the memory cell (the word line) as the access target by a combining circuit. Then, the combined signals are output as a storage section output signal FA<0> externally from the circuit 60. Note that among all the bits included in the input row address information, the row address information of one bit corresponding to each digit (bit) is input into each of the storage sections 60. In FIG. 6, for example, the row address information RA<0> indicates the least significant bit ("0" or "1") of the row address information. The combining circuit includes a clocked inverter CIC and a switch SW. The clocked inverter CIC and the switch SW combine the defect address information for the one selected bit with the row address information for one bit of the word line as the access target.

The clocked inverter CIC is constituted of P-type and N-type MIS transistors PT68A, NT68A constituting a CMOS inverter, and P-type and N-type MIS transistors PT68B, NT68B which function as transfer transistors. One end of a current path of the P-type MIS transistor PT68B is connected to a power supply terminal Vdd5, and the other end of the current path of the P-type MIS transistor PT68B is connected to one end of a current path of the P-type MIS transistor PT68A. One end of a current path of the N-type MIS transistor NT68B is connected to the ground terminal Vss5, and the other end of the current path of the N-type MIS transistor NT68B is connected to one end of a current path of the N-type MIS transistor NT68A.

The switch SW is constituted of one P-type MIS transistor PT69 and one N-type MIS transistor NT69. One end of a current path of the P-type MIS transistor PT69 is connected to one end of a current path of the N-type MIS transistor NT69, and the connected contact is an input node of the switch SW. Moreover, the other end of the current path of the P-type MIS transistor PT69 is connected to the other end of the current path of the N-type MIS transistor NT69, to form an output node of the switch SW.

A signal output to the clocked inverter CIC through the node ne is input into a gate of the P-type MIS transistor PT68B as the transfer transistor, and a signal output to the node nf is input into a gate of the N-type MIS transistor NT68B as the transfer transistor.

Moreover, a signal output to the switch SW through the node ne is input into a gate of the N-type MIS transistor NT69, and a signal output to the node nf is input into a gate of the P-type MIS transistor PT69.

The node ne is connected to an output terminal of an inverter 64B.

The row address information RA<0> is input into input nodes of the CMOS inverters PT68A, NT68A. Moreover, the row address information RA<0> is input into the input node of the switch SW.

When the fuses 62A, 62B are not fused, that is, when the level of the signal output to the nodes na, nb is the "L" level, the signal level of the node ne becomes the "H" level by the inverter 64B. On the other hand, the signal level of the node nf becomes the "L" level.

In this case, the P-type MIS transistor PT68B as the transfer transistor turns off by the signal (the "H" level) from the node ne, and the N-type MIS transistor NT68B as the transfer transistor turns off by the signal (the "L" level) from the node nf. Therefore, the clocked inverter CIC is turned off.

At this time, in the switch SW, the P-type transistor PT69 constituting the switch turns on by the signal (the "L" level) from the node nf, and the N-type transistor NT69 constituting the switch receives the signal (the "H" level) from the node ne to turn on. Therefore, the switch SW turns on.

Therefore, the output signal of the switch SW is output as the storage section output signal FA<0> externally from the storage section 60. The output storage section output signal FA<0> is an in-phase signal with respect to the row address information RA<0>.

When the fuses 62A, 62B are fused, that is, when the signals output to the nodes na, nb is the "H" level, the signal level of the node ne becomes the "L" level by the inverter 64B, and the signal level of the node nf becomes the "H" level. Therefore, the clocked inverter CIC and the switch SW perform operations reverse to those in a case where the fuses 62A, 62B are not fused.

That is, the P-type MIS transistor PT68B as the transfer transistor turns on by the signal (the "L" level) from the node ne, and the N-type MIS transistor NT68B as the transfer transistor turns on by the signal (the "H" level) from the node nf. Therefore, the clocked inverter CIC turns on, and the signal RA<0> input into the input node can be transferred to the output node.

On the other hand, in the switch SW, the P-type transistor PT69 turns off by the signal (the "H" level) from the node nf, and the N-type transistor NT69 turns off by the signal (the "L" level) from the node ne. Therefore, the switch SW turns off.

In consequence, the selection row address information RA<0> is output externally from the storage section 60 through the clocked inverter CIC, and hence the storage section output signal FA<0> is a signal obtained by reversing the selection row address information RA<0>.

Therefore, in a case where the fuses 62A, 62B are not fused, when the row address information RA<0> is "0", the storage section output signal FA<0> indicates "0" (the "L" level). When the row address information RA<0> is "1", the storage section output signal FA<0> indicates "1" (the "H" level).

Moreover, in a case where the fuses 62A, 62B are fused, when the row address information RA<0> is "0", the storage section output signal FA<0> indicates "1" (the "H" level). When the row address information RA<0> is "1", the storage section output signal FA<0> indicates "0" (the "L" level).

As described above, the fusing of the fuses 62A, 62B corresponds to the row address information of "1", and the non-fusing of the fuses 62A, 62B corresponds to the row address information of "0". Therefore, when the read signal levels corresponding to states (fused/non-fused) of the fuses 62A, 62B match those of the input row address information RA<0>, the storage section output signal FA<0> indicates "0" (the "L" level).

Note that the defect address information storage sections 60 as many as the bits of the row address information of the semiconductor memory are provided in the chip. Therefore, when the row address information included in the selection address information is represented by 11 bits, storage section output signals FA<0>, FA<1>, . . . , FA<10> for one bit are output from 11 defect address information storage sections 60 for the respective bit digits, respectively. Hereinafter, the plurality (for example, 11 bit) of storage section output signals FA<0>, FA<1>, . . . FA<10> will also be referred to as "FA<0:10>".

Note that when each of the memory cell arrays 1A to 1D is divided into four segments as shown in FIG. 2, to correspond to column address information CAn, CA(n-1) for two bits, four fuses, and latch circuits or clocked inverters as a control circuit for these fuses are provided in the storage section 60. Moreover, one storage section output signal FA<0> is output in accordance with the states of four fuses and the input row address information.

As described above, the judgment of the address of the defective cell and the control of the remedy of the defective cell can be performed for each segment set by using the column address information CAn by the defect address storage section 60 shown in FIG. 6.

Figure 7:
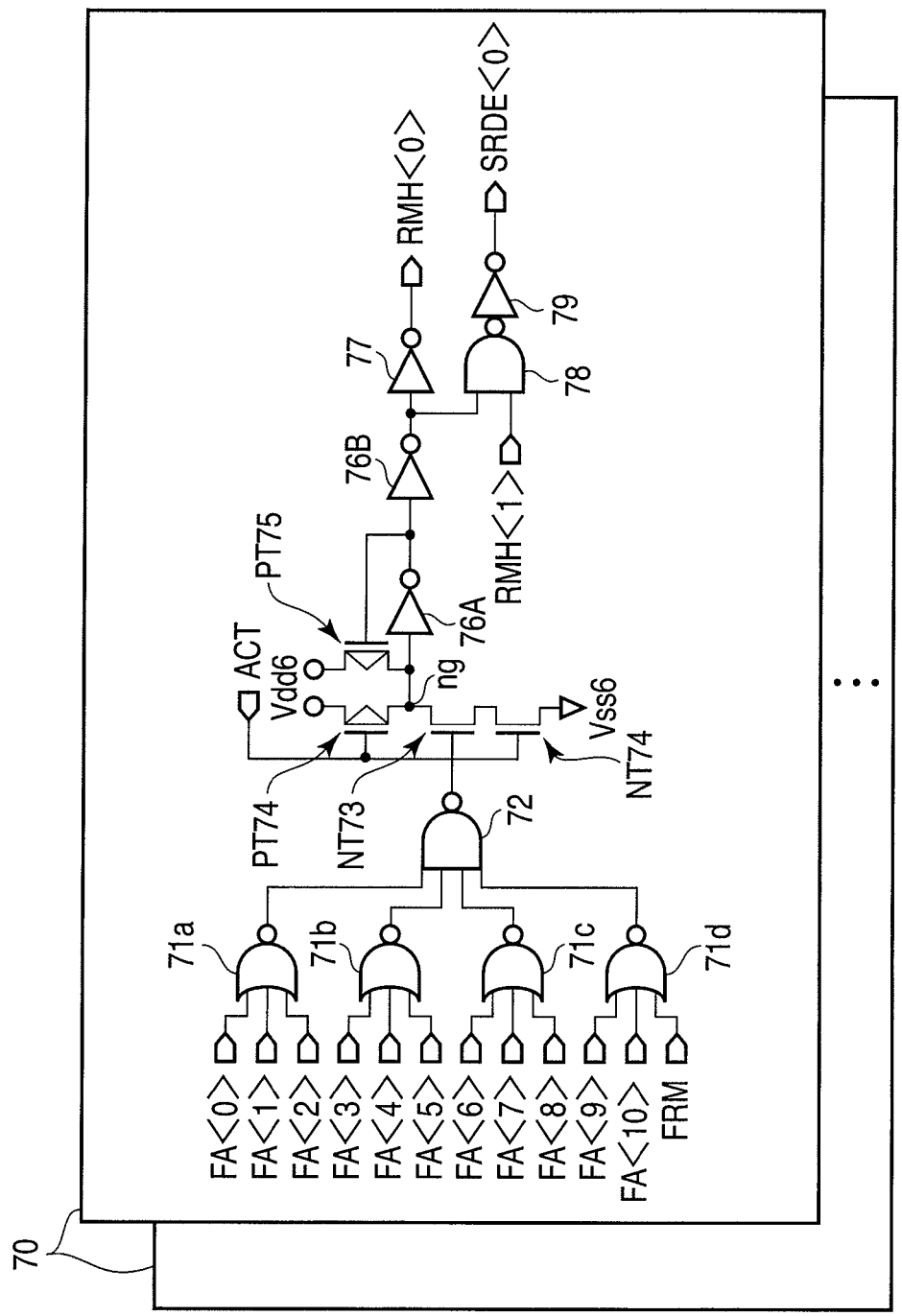
FIG. 7 is an equivalent circuit diagram showing one example of the circuit for remedying the defective cells.

FIG. 7 shows one example of the circuit constitution of the address comparison section 70.

The address comparison sections 70 corresponding to the freedom degree of the remedy of the defective cells are provided in the chip. That is, when the freedom degree of the remedy is 16, the number of the provided address comparison sections 70 is 16. Moreover, one address comparison section 70 corresponds to one group of the defect address information storage sections.

Into the one address comparison section 70, the storage section output signals FA<0:10> output from the one group of the defect address information storage sections 60 are input. The address comparison section 70 compares the address information input from the outside with the storage section output signals FA<0:10> to judge whether or not the information matches the signals FA<0:10>.

The address comparison section 70 shown in FIG. 7 requests for the remedy of the defective cell, when all the input storage section output signals FA<0:10> indicate the "L(0)" level. Note that all the storage section output signals FA<0:10> indicate "L" in a case where all the bits of the defect address information corresponding the states (fused/non-fused) of the fuses match all the bits of the input row address information.

The address comparison section 70 has four 3-input NOR gate (the first calculating section) 71a to 71d in an input initial stage thereof. Into input terminals of the three NOR gates 71a to 71c, storage section output signals FA<0:8> output from the defect address information storage sections 60 are input, respectively. Moreover, into two of three input terminals of the one remaining NOR gate 71d, two storage section output signals FA<9>, FA<10> are input, respectively, and into the one remaining input terminal, an address comparison active signal FRM is input. When the address comparison active signal FRM of the "L(0)" level is input, the address comparison section 70 starts judging whether the defect address information matches or does not match the row address information based on the logical states ("0" or "1") of the storage section output signals FA<0:10>.

Output terminals of the NOR gates 71a to 71d are connected to four input terminals of one 4-input NAND gate 72, respectively. An output terminal of the NAND gate 72 is connected to a gate of an N-type MIS transistor NT73.

One end of a current path of the N-type MIS transistor NT73 is connected to one end of a current path of a P-type MIS transistor PT74, and a contact point between these current paths is an output node ng. The other end of the current path of the P-type MIS transistor PT74 is connected to a power supply terminal Vdd6.

The other end of the current path of the N-type MIS transistor NT73 is connected to one end of a current path of an N-type MIS transistor NT74. The other end of the current path of the N-type MIS transistor NT74 is connected to a ground terminal Vss6.

Into gates of the P-type MIS transistor PT74 and the N-type MIS transistor NT74, chip activation signals ACT are input. The chip activation signal ACT changes from the "L" level to the "H" level, when an access command for instructing the writing or reading of the data is input into the chip. While the chip activation signal ACT changes from the "L" level to the "H" level, the power supply potential Vdd6 is supplied to the node ng through the current path of the P-type MIS transistor PT74 having an on-state. In consequence, the node ng is approximately charged with the power supply potential Vdd6.

Output nodes of the N-type MIS transistor NT73 and the P-type MIS transistor PT74 are connected to an input terminal of an inverter (an NOT gate) 76A.

This inverter 76A is connected in parallel with a P-type MIS transistor PT75. A gate of the P-type MIS transistor PT75 is connected to an output terminal of the inverter 76A. One end of a current path of the P-type MIS transistor PT75 is connected to the input terminal of the inverter 76A, and the other end of the current path of the P-type MIS transistor PT75 is connected to the power supply terminal Vdd6. The P-type MIS transistor PT75 is provided to compensate for the operation of the P-type MIS transistor PT74 using the chip activation signal ACT as a control signal, and the output node ng is prevented from being floated.

The output terminal of the inverter 76A is connected to an input terminal of an inverter 76B. In consequence, the output signal of the inverter 76B has the same phase as that of a signal output from the output node ng.

An output terminal of the inverter 76B is connected to an input terminal of an inverter 77.

The inverter 77 reverses an input signal, and outputs the signal as a comparison signal RMH<0> to the remedy judgment section 80 described later.

When all the storage section output signals FA<0:10> indicate the "L(0)" level, the output signal of the "L" level is input into the gate of the N-type MIS transistor NT73, and the N-type MIS transistor NT73 turns off. Therefore, the charged state of the node ng is held, and the signal level of the node ng is the "H" level.

Therefore, when all the storage section output signals FA<0:10> have the "L" level, the comparison signal RMH<0> indicates the "L(0)" level. That is, the comparison signal RMH<0> turns to the "L" level, when the defect address information matches the selection row address information.

When at least one of the storage section output signals FA<0:10> has the "H" level, the output signal of the "H" level is input into the gate of the N-type MIS transistor NT73, and the N-type MIS transistor NT73 turns on. Moreover, the N-type MIS transistor NT74 turns on, when the chip activation signal ACT changes from the "L" level to the "H" level. The potential (an electric charge) charged into the output node ng is discharged to the ground terminal Vss6 through the current paths of the N-type MIS transistors NT73, NT74 having the on-state. Therefore, the signal level of the node ng becomes the "L" level.

Therefore, when one or more of the storage section output signals FA<0:10> has the "H" level, the comparison signal RMH<0> indicates the "H(0)" level. That is, the comparison signal RMH<0> of the "H" level corresponds to a case where the defect address information does not match the selection row address information. Thus, the comparison signal RMH<0> turns to the "H" level synchronously with the change of the chip activation signal ACT from the "L" level to the "H" level.

The output terminal of the inverter 76B is connected to one of input terminals of a 2-input NAND gate 78. Into the other input terminal of the NAND gate 78, a comparison signal RMH<1> from the other address comparison section disposed adjacent to the section is input.

The NAND gate 78 outputs the calculation result of the output signal from the inverter 76B (the node ng) and the comparison signal RMH<1> as a match signal SRDE<0> to the remedy judgment section 80 through an inverter 79.

The match signal SRDE<0> output from the address comparison section 70 indicates a state in which the storage section output signal FA<0> matches the input selection row address information. When this match signal SRDE<0> changes from the "L" level to the "H" level, the row remedy of the defective cells is requested. The match signal SRDE<0> of the "L" level indicates that the remedy using the redundant word line corresponding to the address comparison section 70 which has output the signal is not executed.

The change of the match signal SRDE<0> from the "L" level to the "H" level can be realized by the change of the comparison signal RMH<1> from the adjacent comparison section 70 from the "L" level to the "H" level. This is because the two comparison signals RMH<0>, RMH<1> do not simultaneously turn to the "L" level (a match state), that is, one memory cell (the defective cell) cannot be remedied by two redundant cells in one access cycle.

As apparent from the description of the address comparison section 70 shown in FIG. 7, when the address information of the defective cell is "0", the fuses 62A, 62B in the defect address information storage section 60 are not fused. When the address information of the defective cell is "1", the fuses 62A, 62B in the defect address information storage section 60 are fused. In consequence, the address comparison section 70 can detect whether or not the address information of the defective cell matches the input selection address information.

Figure 8:
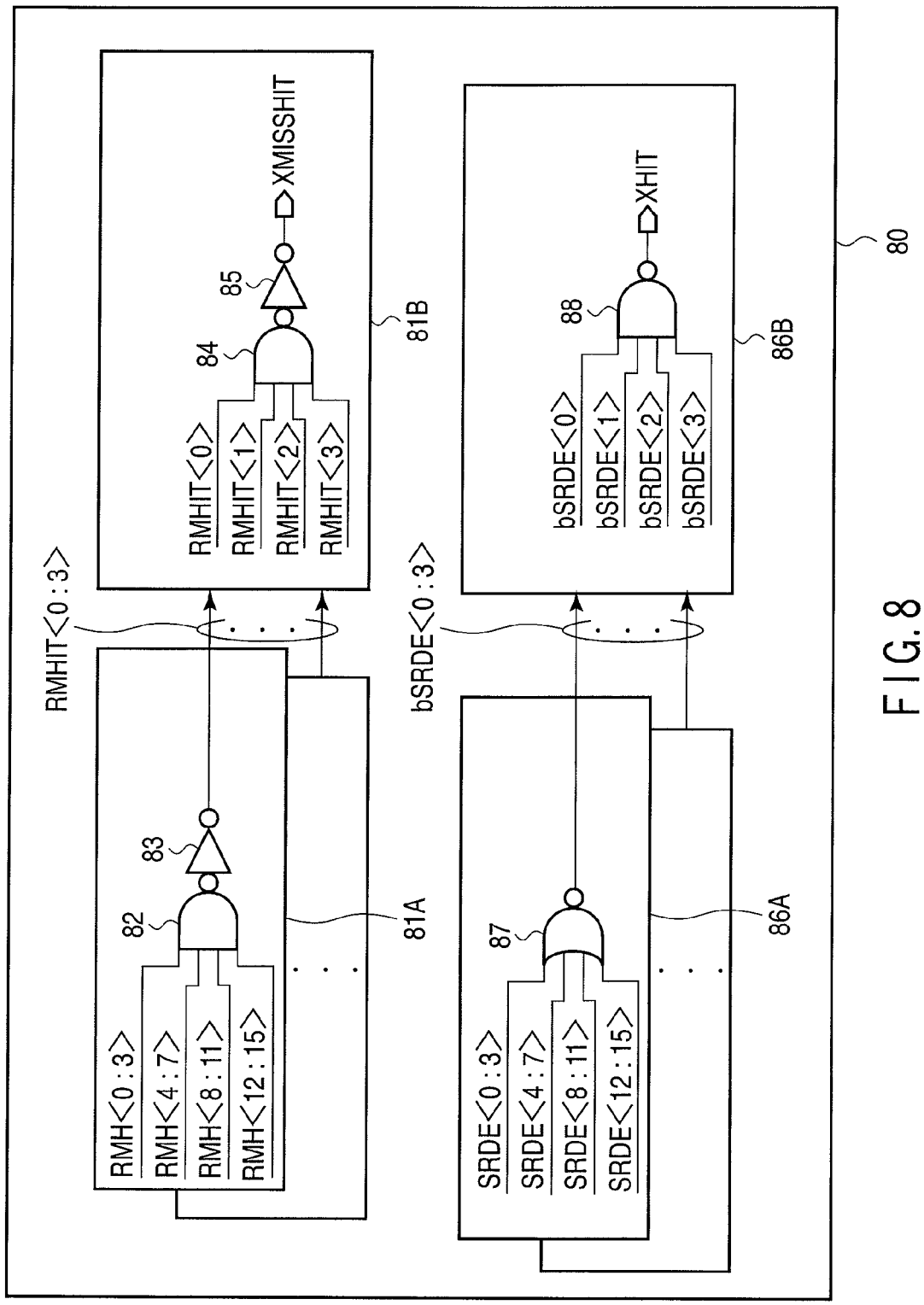
FIG. 8 is an equivalent circuit diagram showing one example of the circuit for remedying the defective cells.

FIG. 8 shows one example of a circuit constitution of the remedy judgment section 80.

The remedy judgment section 80 shown in FIG. 8 integrates a plurality of pieces of information output from the address comparison sections 70 to finally judge whether to activate or deactivate the memory cell (the word line) as the access target. Into the remedy judgment section 80 of FIG. 8, output signals RMH<0:15>, SRDE<0:15> of 16 address comparison sections 70 are input. Note that the number of the address comparison sections 70 corresponds to the freedom degree of the remedy of the chip, and hence the remedy judgment section 80 shown in FIG. 8 has the circuit constitution used in a case where the freedom degree of the remedy is 16.

In this case, calculating units 81A, 81B, 86A and 86B constituting the remedy judgment section 80 calculate 16 comparison signals RMH<0:15> and 16 match signals SRDE<0:15>. Here, the comparison signals RMH<0:15> indicate the comparison signals RMH<0>, RMH<1>, ... RMH<14> and RMH<15>. Moreover, the match signals SRDE<0:15> are similar to the comparison signals RMH<0:15>.

In the remedy judgment section 80, the 16 comparison signals RMH<0:15> are calculated by the calculating units 81A, 81B.

The 16 comparison signals RMH<0:15> are input into the calculating unit 81A. The one calculating unit 81A includes one 4-input NAND gate 82 and an inverter (an NOT gate) 83 connected to an output terminal of the gate 82. In the present example, with respect to the 16 comparison signals RMH<0:15>, four calculating units 81A are provided in the remedy judgment section 80. The comparison signals RMH<0:15> are input into input terminals of the NAND gate, respectively. In FIG. 8, for the simplicity of the drawing, the inner constitution of one calculating unit 81A is shown, and the comparison signals input into the terminals are shown as RMH<0:3>, RMH<4:7>, RMH<8:11> and RMH<12:15>, respectively.

The four comparison signals are logically calculated by the one NAND gate 82.

The calculation result obtained by the one NAND gate 82 is output as an output signal RMHIT<0> through the inverter (the NOT gate) 83. Therefore, the four calculating units 81A output four output signals RMHIT<0:3>.

The output signals RMHIT<0:3> are input into the calculating unit 81B. This calculating unit 81B includes one 4-input NAND gate 84 and one inverter (an NOT gate) 85. The four output signals RMHIT<0:3> are logically calculated by the NAND gate 84.

The calculation result obtained by the NAND gate 84 is output as an output signal XMISSHIT from the remedy judgment section 80 through the inverter 85.

In the present example, the output signal XMISSHIT indicates the "H" level, when all the comparison signals RMH<0:15> indicate the "H" level. This output signal XMISSHIT of the "H" level corresponds to a case where the defect address information does not match the selection row address information.

Thus, when no redundant cell is used, that is, when the defective cell does not have to be remedied with respect to the address information input, into the chip, the output signal XMISSHIT indicates the "H" level.

In consequence, when the output signal XMISSHIT has the "H" level, the word line in the memory cell array indicated by the input address information is activated, and the memory cell connected to the word line becomes the access target. Note that when the remedy of the defective cell is executed, the output signal XMISSHIT indicates the "L" level.

In the remedy judgment section 80, the match signals SRDE<0:15> are calculated by the calculating units 86A, 86B.

The 16 match signals SRDE<0:15> are input into the calculating unit 86A. The one calculating unit 86A includes one 4-input NOR gate 87. In this case, with respect to the 16 match signals SRDE<0:15>, four calculating units 86A are provided in the remedy judgment section 80.

The match signals SRDE<0:15> are input into input terminals of the NOR gate 87, respectively. Note that in FIG. 8, for the simplicity of the drawing, the inner constitution of the one calculating unit 86A is shown, and the match signals input into the terminals are shown as SRDE<0:3>, SRDE<4:7>, SRDE<8:11> and SRDE<12:15>, respectively.

The calculation results obtained by the NOR gates 87 are output as output signals bSRDE<0:3>. Four output signals bSRDE<0:3> are output from the four calculating units 86A to the calculating unit 86B.

The output signals bSRDE<0:3> are input into the calculating unit 86B. This calculating unit 86B includes one 4-input NAND gate 88. The four output signals bSRDE<0:3> are logically calculated by the NAND gate 88.

The calculation result obtained by the NAND gate 88 is output as an output signal XHIT from the remedy judgment section 80.

In the present example, the output signal XHIT indicates the "H(1)" level, when at least one of the plurality of match signals SRDE<0:15> has the "H(1)" level. The output signal XHIT of this "H" level corresponds to a case where the defect address information matches the input selection address information.

Thus, when the redundant cell is used, that is, when the defective cell in the chip needs to be remedied, the output signal XHIT indicates the "H" level.

In consequence, when the output signal XHIT has the "H" level, a certain redundant word line in the redundant cell array is activated, and the redundant cell connected to the redundant word line becomes the access target. Note that when no defective cell is remedied, the output signal XHIT indicates the "L" level.

The signal XMISSHIT output from the remedy judgment section 80 shown in FIG. 8 as described above indicates the calculation result of the NAND logic of the comparison signals RMH<0:15>. Moreover, the signal XHIT output from the remedy judgment section 80 indicates the calculation result of the OR logic of the match signals SRDE<0:15>.

In consequence, when the input row address information does not match all the plurality of pieces of the defect address information, the remedy of the defective cell is not executed. Moreover, when the input row address information matches one of the plurality of pieces of the defect address information, the operations of the word line and the redundant word line are controlled by the row decoder so as to remedy the defective cell by the row remedy method combined with the column address information.

According to the above constitution in the resistance variable semiconductor memory of the first embodiment of the present invention, the column address information is combined, whereby a part of the word line connected to the defective cell can be replaced with a part of the redundant word line, and the defective cell can be remedied.

(b) Operation

Hereinafter, the operation of resistance variable semiconductor memory according to the first embodiment of the present invention will be described with reference to FIG. 9. Note that here, the operation will be described with reference to the equivalent circuit diagrams shown in FIGS. 1 to 8 together with FIG. 9.

In the memory chip having the circuit shown in FIGS. 1 to 8, after manufacturing the memory chip, a test step is executed to detect the defective cells in the memory cell arrays 1A to 1D. In the present embodiment, the address information of the defective cells are stored in the fuses 62A, 62B of the defect address information storage sections 60. Moreover, a correspondence between each defective cell (the word line) and each redundant cell (the redundant word line) is also set beforehand.

Figure 9:
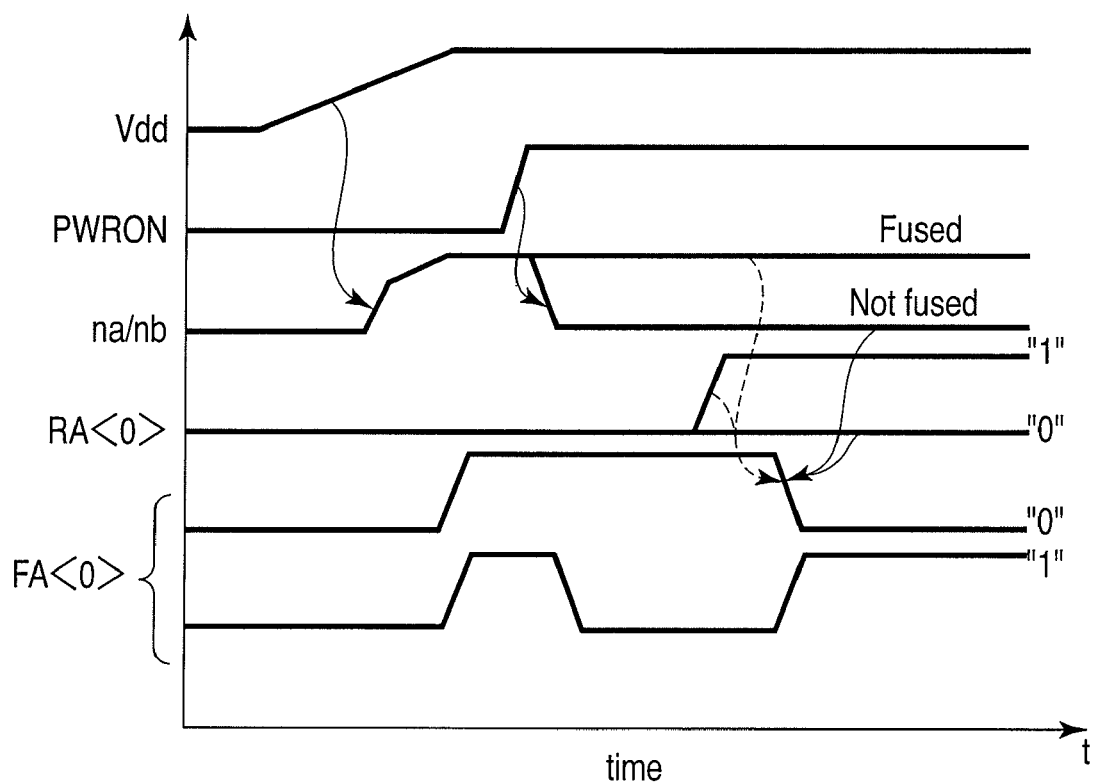
FIG. 9 is a timing chart for explaining the operation of the circuit for remedying the defective cells.

As shown in FIG. 9, the power supply potential Vdd is introduced into the memory chip. In an initial stage in which the power supply potential Vdd is introduced, a power-on signal PWRON as a chip startup signal indicates the "L" level.

Then, in a case where the power supply potential Vdd reaches a predetermined potential which can drive the chip, the chip startup signal PWRON changes from the "L" level to the "H" level.

In the defect address information storage sections 60 shown in FIG. 6, in a case where the signal level of the chip startup signal PWRON changes from the "L" level to the "H" level, when the fuses 62A, 62B are fused, the nodes na, nb are charged with the power supply potentials Vdd1, Vdd2. Therefore, the signal levels of the nodes na, nb of the CMOS inverter are the "H" level. On the other hand, when the fuses 62A, 62B are not fused, the potentials supplied to the nodes na, nb are discharged to the ground terminal Vss through the fuses 62A, 62B. Therefore, the signal levels of the output nodes na, nb of the inverter are the "L" level.

Then, during the operation of the chip, the signals (the "H" or "L" level) of the nodes na, nb are held as the reverse signals of the nodes na, nb in the output nodes na', nb' of the latch circuits 63A, 63B. Thus, during the operation of the chip, the state latched by the output nodes na', nb' becomes an initial state for reading the address information of the defective cells, and information indicating the fused/non-fused state of the fuse is held.

Next, when the writing or reading operation is instructed with respect to the chip, the address information (the selection address information) indicating the position of the memory cell as the access target is input into the chip. This selection address information includes the row address information indicating the word line (the row) and the column address information indicating the bit line (the column).

In the present embodiment, by the column address information CAn ("0(L)" or "1(H)") for one bit, one of the clocked inverters CIA, CIB corresponding to the fuses 62A, 62B turns on. Then, one of the signals ("H" or "L") held in each of the output nodes na', nb' is output to the output nodes nc, nd of the one clocked inverter which has turned on.

In case of the column address information CAn="0" (=the "L" level), the information (the signal) of the node na' (na) is transferred to the node nc. On the other hand, in case of the column address information CAn="1" (=the "H" level), the information (the signal) of the node nb' (nb) is transferred to the node nd. Thus, in the present embodiment, at the time of the reading of the defect address information by the row remedy method, the column address information CAn of the defective cells is reflected.

The transferred signals of the nodes na', nb' are reversed and output by the clocked inverters CIA, CIB which are turned on. Therefore, the signal levels of the output nodes nc, nd have the same phase as that of the signal levels of the nodes na, nb.

The signals transferred to the output nodes nc, nd are output to the nodes (lines) ne, nf. The signal level of the signal output to the node ne is opposed to that of the signal in the output nodes nc, nd by the inverter 64B. The signal level of the signal output to the node nf is the same as that of the signal in the output nodes nc, nd.

When the fuses 62A, 62B are not fused, that is, when the levels of the signals output from the output nodes nc, nd are the "L" level, the transistors PT68B, NT68B as the transfer transistors turn off, and the clocked inverter CIC turns off. On the other hand, the two transistors PT69, NT69 constituting the switch SW turn on.

Therefore, since the row address information RA<0> is output through the switch SW, as shown in FIG. 9, the storage section output signal FA<0> indicates the signal having the same phase as that of the row address information RA<0>. That is, in a case where the fuses 62A, 62B are not fused, when the row address information RA<0> is "0", the storage section output signal FA<0> indicates "0" (the "L" level). When the row address information RA<0> is "1", the storage section output signal FA<0> indicates "1" (the "H" level).

When the fuses 62A, 62B are fused, that is, when the levels of the signals output from the output nodes nc, nd are the "H" level, the clocked inverter CIC turns on (a transferable state), and the switch SW turns off. Therefore, since the row address information RA<0> is output through the clocked inverter CIC, the storage section output signal FA<0> indicates the reverse signal of the row address information RA<0>. That is, in a case where the fuses 62A, 62B are fused, when the row address information RA<0> is "0", the storage section output signal FA<0> indicates "1" (the "H" level). When the row address information RA<0> is "1", the storage section output signal FA<0> indicates "0" (the "L" level).

As described above, the fuses 62A, 62B are not fused, when the row address information RA<0> is "0". And the fuses 62A, 62B are fused, when the row address information RA<0> is "1". Therefore, when the read signals (the defect row address information) indicated by the states (fused/non-fused) of the fuses 62A, 62B match the input row address information RA<0>, the storage section output signal FA<0> of the "0" level is output.

Such an operation is executed by the 11 defect address information storage sections 60, respectively, when the row address information is constituted of 11 bits. Moreover, the group of the defect address storage sections corresponding to the freedom degree of the remedy executes a similar operation.

As described above, the row address information RA<0> ("0" or "1") of the defective cells is indicated depending on whether or not the fuses are fused. Moreover, based on the column address information CAn, the information of one of the plurality of (two in the present example) fuses 62A, 62B is selectively output. Therefore, the output signal of the defect address information storage section 60 indicates the word line corresponding to the row address information and connected to each defective cell, and the region of the memory cell array which corresponds to the column address information and in which the defective cell is present.

As shown in FIG. 7, the storage section output signals FA<0:10> output from the 11 defect address information storage sections 60, respectively, are input into the one address comparison section 70.

The 11 storage section output signals FA<0:10> are input into the input terminals of the four 3-terminal NOR gates 71a to 71d, respectively, and the address comparison active signal FRM is input into one of the input terminals of the NOR gates 71a to 71d. When the power source voltage is introduced into the chip, the address comparison active signal FRM changes from the "H(1)" level to the "L(0)" level. Synchronously with this, it starts to be judged whether or not the input storage section output signals FA<0:10> match.

After introducing the power supply voltage into the chip, when the access command is input into the chip, the chip activation signal ACT also changes from the "L" level to the "H" level. In a period when the signal level of the chip activation signal ACT indicates the "L" level, the signal level of the node ng is initialized to the "H" level.

As described above, in each of the plurality of defect address information storage sections 60, when the read signals indicated by the states (fused/non-fused) of the fuses 62A, 62B match the input row address information RA<0:10>, the storage section output signals FA<0:10> are "0" (the "L" level).

When the plurality of storage section output signals FA<0:10> are all "0(L)" and the address comparison active signal FRM is "0", the respective NOR gates 71a to 71d output the calculation result "1(H)" to the NAND gate 72. Consequently, the NAND gate 72 outputs the signal of "0(L)" to the gate of the N-type MIS transistor NT73. In consequence, the N-type MIS transistor NT73 turns off, and the signal level indicated by the node ng is held at the "H(1)" level.

When even one of the storage section output signals FA<0:10> includes "1(H)", one of the NOR gates 71a to 71d outputs "0". In consequence, the output to the NAND gate 72 becomes "1" (the "H" level). Therefore, the N-type MIS transistor NT73 turns on. Moreover, when the chip activation signal ACT has the "H" level, the P-type MIS transistor PT74 turns off, and the N-type MIS transistor NT74 turns on. In consequence, the potential of the node ng is equal to that of the ground terminal Vss6.

Therefore, when the storage section output signals FA<0:10> include "1", the signal level of the node ng becomes the "L(0)" level. Note that while the address comparison active signal FRM indicates the "H(1)" level, the NAND gate 72 outputs the signal of the "0(L)", and hence the N-type MIS transistor NT73 is turned off.

The output signal of the node ng is output as the comparison signal RMH<0> to the judgment section 80 through the three inverters 76A, 76B and 77. Therefore, when the signal level of the node ng is the "L" level, the comparison signal RMH<0> indicates the "H" level. The comparison signal RMH<0> of this "H" level corresponds to a case where the row address information of the defective cell does not match the selection row address information, and therefore the remedy of the defective cell is not requested.

On the other hand, when the signal level of the node ng is the "H" level, the comparison signal RMH<0> indicates the "L" level. The comparison signal RMH<0> of the "L" level corresponds to a case where the address information, of the defective cell matches the input row address information.

The output signal of the node ng is input into the NAND gate 78 through the two inverters 76A, 76B. Then, the NAND gate 78 calculates the output signal of the node ng together with the comparison signal RMH<1> from the adjacent address comparison section. The calculation result obtained by the NAND gate 78 is output as the match signal SRDE<0> to the judgment section 80 through the inverter 79. When the match signal SRDE<0> changes from the "L(0)" level to the "H(1)" level, the remedy of the defective cell is requested.

When all the storage section output signals FA<0:10> input into the address comparison section 70 indicate the "L" level as described above, it is indicated that the row address information of the defective cell matches the row address information of the selected memory cell, that is, that the word line connected to the defective cell is selected. In consequence, the comparison signal RMH<0> turns to the "L" level, and the match signal SRDE<0> turns to the "H" level, whereby the remedy of the defective cell is executed.

Moreover, when at least one of the storage section output signals FA<0:10> includes the "H" level, it is meant that the word line connected to the defective cell is not selected, and the comparison signal RMH<0> turns to the "H" level, so that the remedy of the defective cell is not performed.

When the freedom degree of the remedy of the defective cell is 16, the 16 address comparison sections 70 are provided in the chip. Then, by the above operations of the address comparison sections 70, the address comparison sections 70 output the comparison signals RMH<0:15> and the match signals SRDE<0:15> to the remedy judgment section 80 shown in FIG. 8, respectively.

The 16 comparison signals RMH<0:15> are calculated by the calculating units 81A, 81B in the judgment circuit 80. The 16 comparison signals RMH<0:15> are subjected to NAND logic calculation by the calculating units 81A, 81B.

Therefore, when all the comparison signals RMH<0:15> have the "H(1)" level, that is, when all the 16 pieces of the defect address information do not match the input row address information, the output signal XMISSHIT indicates the "H(1)" level. When the output signal XMISSHIT of the "H(1)" level is output, the remedy of the defective cell is not executed.

On the other hand, the 16 match signals SRDE<0:15> are calculated by the calculating units 81A, 81B in the judgment circuit 80. The 16 match signals SRDE<0:15> are subjected to OR logic calculation by the calculating units 81A, 81B.

Therefore, when one of the input match signals SRDE<0:15> has the "H(1)" level, that is, one of the plurality of pieces of the stored defect address information matches the input row address information, the output signal XHIT indicates the "H(1)" level. When the output signal XHIT of the "H(1)" level is output, the remedy of the defective cell is executed.

In a case where it is judged by this operation that the defective cell be remedied, instead of the word line indicated by the input row address information, the redundant word line is activated. Then, the writing of the data or the reading of the data is executed with respect to the redundant cell corresponding to the same column address information (the segment) for one bit as the information of the defective cell in the plurality of redundant cells connected to the activated redundant word line.

As described above, the defect address information (the address of the word line) is stored in the plurality of defect address information storage sections 60, based on whether or not the fuses are fused. The number of the fuses of each defect address information storage section is the same as that of the segments of the memory cell array based on the column address information. Then, based on the column address information, the information of one of the two or more fuses is output. Thus, the defect address information is stored for each region (segment) corresponding to the column address information CAn in the defect address information storage section 60, and is individually read based on the input column address information.

Consequently, in a case where the row remedy method is employed as in the present embodiment, it is possible to specify the column of the memory cell array in which the defective cell is present, that is, the part of the one word line connected to the defective cell.

Then, based on the defect address information associated with the column address information, the address comparison section 70 and the judgment section 80 judge whether or not the remedy of the defective cell is necessary.

Therefore, two or more segments are set in the memory cell array based on the column address information, whereby a part of the word line corresponding to the segment is regarded as the remedy unit, and a part of the word line connected to the defective cell can be replaced with a part of the redundant word line.

Note that in a case where the memory cell connected to the word line including the defective cell and provided in the segment in which no defective cell is present becomes the target of the access, the word line is activated, and the memory cell connected to the word line is used.

For example, in a case where the resistance variable semiconductor memory of the present embodiment is the random access memory, every time the address information for the writing/reading is input, the above operation is executed as needed.

When the word line is logically divided and controlled based on the column address information as described above, the number of the defective cells which can be remedied can be increased without involving the increase of the number of the redundant word lines or the increase of the occupying area of the redundant cell array.

Therefore, according to the resistance variable semiconductor memory of the first embodiment of the present invention, the remedy efficiency of the defective cell can be improved.

Second Embodiment

A second embodiment of the present invention will be described with reference to FIGS. 10 and 11. Note that in FIGS. 10 and 11, substantially the same constituent elements as those of the first embodiment are denoted with the same reference numerals, and the detailed description thereof is performed if necessary.

FIG. 10 shows a circuit constitution near memory cell arrays of a semiconductor memory having a word line constitution referred to as a hierarchical word line system.

In memory cell arrays 9A to 9D of the hierarchical word line system shown in FIG. 10, the word line constitution has two classes. Therefore, each word line of the present embodiment includes a main word line MWL and a sub-word line SWL connected to the main word line MWL.

The memory cell arrays 9A to 9D include a plurality of physically divided regions 90A to 90D, 91A to 91D. In the present embodiment, the physically divided regions 90A to 90D, 91A to 91D will be referred to as the blocks 90A to 90D, 91A to 91D.

In the example shown in FIG. 10, each of the memory cell arrays 9A to 9D has two blocks 90A to 90D, 91A to 91D. In one of the memory cell arrays 9A to 9D, two blocks 90A to 90D, 91A to 91D are arranged side by side in an y-direction.

In each of the memory cell arrays 9A to 9D, a plurality of main word lines MWL are provided. The main word lines MWL extend in, for example, a y-direction, and are arranged side by side in the x-direction. The plurality of main word lines MWL are disposed across two adjacent blocks 90A to 90D, 91A to 91D in the y-direction.

A plurality of sub-word lines SWL are provided in each of the blocks 90A to 90D, 91A to 91D. The plurality of sub-word lines SWL are connected in common to the one main word line MWL. The sub-word lines SWL extend in the y-direction, and are arranged side by side in the x-direction.

One main row decoder 20A is provided for one of the memory cell arrays 9A to 9D, and is used in common by the plurality of blocks 90A to 90D, 91A to 91D which share the main word lines MWL. The main row decoder 20A controls the activation and deactivation of the main word lines MWL based on input row address information.

Sub-row decoders 21A to 21D, 22A to 22D are provided adjacent to the blocks 90A to 90D, 91A to 91D in the y-direction. Each of the sub-row decoders 21A to 21D, 22A to 22D is provided for each of the blocks 90A to 90D, 91A to 91D. Moreover, the sub-row decoders 21A to 21D, 22A to 22D control the activation and deactivation of the sub-word lines SWL.

A redundant cell array 100 including a plurality of redundant cells employs the hierarchical word line system in the same manner as in the memory cell arrays 9A to 9D. The one redundant cell array 100 includes two physically divided redundant blocks 110, 111.

A plurality of redundant main word lines RMWL are arranged across the two redundant blocks 110, 111 disposed adjacent in the y-direction. The redundant main word lines RMWL extend in the y-direction, and are arranged side by side in the x-direction. A plurality of redundant sub-word lines RSWL are provided in each of the redundant blocks 110, 111. The redundant sub-word lines RSWL extend in the y-direction, and are arranged side by side in the x-direction. The plurality of redundant sub-word lines RSWL are connected in common to the one redundant main word lines RMWL.

A spare main row decoder 50 is provided for the one redundant cell array 100, and is used in common for the redundant blocks 110, 111. Each of redundant sub-row decoders 51, 52 is provided for each of the redundant blocks 110, 111.

The activation/deactivation of the redundant main word lines RMWL is controlled by the spare main row decoder 50. The activation/deactivation of the redundant sub-word lines RSWL is controlled by the redundant sub-row decoders 51, 52.

In a case where the hierarchical word line system is employed, when the length of each word line increases owing to the increase of the scale of the memory cell array, it is possible to suppress the increase of interconnect delay and the decrease of manufacturing yield due to the increase of the length of a interconnection.

FIG. 11 shows one example of an inner constitution of the row decoders 20A, 21A and 22A in the case where the hierarchical word line system is employed.

In the constitution example shown in FIG. 11, the one main word line MWL is disposed across the two blocks 90A, 91A. The main word line MWL is used in common by the plurality of sub-word lines SWL. Four sub-word lines SWL are provided in each of the blocks 90A, 91A. Note that in FIG. 11, for the simplicity of the description, only one main word line is shown, but needless to say, two or more main word lines may be arranged in the memory cell array. Similarly, the number of the sub-word lines and the number of the memory cell arrays are not limited to the numbers shown in FIG. 11.

The main row decoder 20A includes, for example, an NAND gate 2. The main word line MWL is connected to an output terminal of the NAND gate 2. Moreover, the row address information is input into an input terminal of the NAND gate 2. The row address information is the row address information of the selected main word line. The input row address information is logically calculated by the NAND gate 2. Based on the calculation result, the activation/deactivation of the main word line MWL is controlled.

In the sub-row decoders 21A, 22A, a plurality of driver units 25 are provided. The number of the driver units provided in one of the sub-row decoders 21A, 22A corresponds to the number of the sub-word lines SWL provided in one of the sub-row decoders 21A, 22A. One of the driver units 25 is connected to one sub-word line SWL.

Moreover, in the sub-row decoders 21A, 22A, first driving lines WDRV<0:3> and second driving lines bWDRV<0:3> are provided. The number of the driving lines WDRV<0:3> or bWDRV<0:3> corresponds to the number of the driver units 25 or the sub-word lines SWL provided in each of the sub-row decoders 21A, 22A. In the constitution example shown in FIG. 11, since the four driver units are provided, four driving lines WDRV<0:3> and four driving lines bWDRV<0:3> are provided. During the driving of the chip, pairs of the first driving lines WDRV<0:3> and the second driving lines bWDRV<0:3> are driven, and are set to mutually opposite signal levels.

Each driver unit 25 has a simple circuit constitution, and includes one P-type MIS transistor 28 and two N-type transistors 29a, 29b.

In each of the sub-row decoders 21A, 22A, one end of a current path of the P-type MIS transistor 28 of the respective driver units 25 is connected to one of the different driving lines WDRV<0:3>, respectively.

The other end of the current path of the P-type MIS transistor 28 is connected to one end of a current path of each of the N-type MIS transistors 29a, 29b. Contact points (nodes) between this P-type MIS transistor 28 and the N-type MIS transistors 29a, 29b are connected to the sub-word line SWL.

The other end of the current path of each of the N-type MIS transistors 29a, 29b is connected to a ground terminal. A gate of the P-type MIS transistor 28 and a gate of the N-type MIS transistor 29a are connected to the main word line MWL.

A gate of the N-type MIS transistor 29b is connected to the driving lines WDRV<0:3>. In the one sub-row decoder 21A or 22A, the gates of the N-type MIS transistors 29b constituting the respective driver units 25 are connected to the different driving lines bWDRV<0:3>, respectively.

The sub-row decoders 21A, 22A control the signal levels of two driving lines WDRV<0:3>, bWDRV<0:3>, whereby the driver units 25 are controlled, and the activation/deactivation of the sub-word lines SWL is controlled. Signals input into the driving lines WDRV<0:3>, bWDRV<0:3> are the address information of the sub-word lines.

A plurality of memory cells MC are connected to each of the sub-word lines SWL, respectively. Each memory cell MC includes one resistance change memory element RM and one select transistor Tr in the same manner as in the first embodiment. In the present embodiment, a gate of the select transistor Tr is connected to the sub-word line SWL.

Note that a connecting relation between the redundant main word line and the redundant sub-word line is similar to that between the main word line MWL and the sub-word line SWL shown in FIG. 11.

The operation of the memory cell array using the hierarchical word line system is as follows.

The row address information for access to the memory cells is input into the main row decoder 20A.

The row address information of the memory cells is logically calculated by the NAND gate 2 in the main row decoder 20A. Based on the calculation result of this NAND gate 2, the main row decoder 20A activates or deactivates the main word line MWL.

Then, the signal level of the activated main word line MWL changes from an "H" level to an "L" level. Note that the signal level of the deactivated main word line MWL indicates the "H" level.

In this state, the driving lines WDRV<0:3>, bWDRV<0:3> provided in the sub-row decoders 21A, 22A are selectively activated based on the input row address information.

When the signal level of the main word line MWL becomes the "L" level, the P-type MIS transistor 28 turns on, and the one N-type MIS transistor 29a turns off.

Then, in a case where one of the driving lines bWDRV<0:3> is set to the "L" level, the other N-type MIS transistor 29b turns off. The driving lines WDRV<0:3> forming the pairs with the driving lines bWDRV<0:3> set to the "L" level are set to the "H" level. Therefore, a contact point between the current path of the P-type MIS transistor 28 and the current path of the N-type MIS transistor 29a is charged with the set potential of the driving lines WDRV<0:3> through the current path of the P-type MIS transistor having an on-state.

In consequence, the signal level of the sub-word line SWL indicated by the row address information changes form the "L" level to the "H" level, and the sub-word line SWL is activated.

Note that the remaining driving lines bWDRV<0:3> which are not selected are set to the "H" level, and the remaining driving lines WDRV<0:3> which are not selected are set to the "L" level. Therefore, the sub-word line SWL which is not selected is not activated.

As described above, the memory cells connected to the main word lines MWL and the sub-word lines SWL can be accessed. By a similar operation, the memory cells (redundant cells) connected to the redundant main word lines RMWL and the redundant sub-word lines RSWL are accessed.

In the second embodiment of the present invention, with respect to the resistive variable semiconductor memory in which the hierarchical word line system is employed, the main word lines are the targets of a row remedy method, and a defective cell is remedied.

In the present embodiment, column address information CAn is assigned to the plurality of physical regions (blocks) 90A to 90D constituting the memory cell arrays 9A to 9D.

During the access to the memory cells, it is judged whether or not to remedy the defective cell. When the defective cell is remedied, one main word line MWL is logically divided into two regions and controlled based on the column address information CAn. Moreover, each part of the divided main word line MWL is replaced with the corresponding part of the redundant main word line RMWL.

For example, as shown in FIG. 10, in the memory cell array 9A, a defective cell $bMC_1$ is included in a sub-word line SWLa connected to a main word line MWLa. The defective cell $bMC_1$ is present in the block 90A corresponding to the column address information CAn="0".

Moreover, in the memory cell array 9C, a defective cell $bMC_2$ is included in a sub-word line SWLc connected to a main word line MWLc. The defective cell $bMC_2$ is present in the block 91C corresponding to the column address information CAn="1".

The defect address information of the defective cells $bMC_1$, $bMC_2$ is stored in accordance with the column address information CAn and it is judged whether or not the defect address information matches the address information input into the chip, by use of, for example, circuits 60, 70 and 80 having a constitution substantially similar to that of FIGS. 5 to 8 described in the first embodiment.

In the present embodiment, a part MWLa<0> or MWLc<1> of the main word line MWLa or MWLc including the defective cell $bMC_1$ or $bMC_2$ is replaced with a part RMWL<0> or RMWL<1> of one redundant main word line RMWL corresponding to the column address information (the block), in a case where the block in which the defective cell is present is identified based on the column address information.

When the defect address information matches the input address information, the part of the main word line is replaced with the part of the redundant main word line, whereby the redundant main word line RMWL is activated, and predetermined redundant cells are used. In consequence, the remedy of the defective cell is executed.

On the other hand, a part MWLa<1> of the main word line MWLa corresponding to the column address information CAn="1" does not include any defective cell. Therefore, when the part MWLa<1> of the main word line MWLa corresponding to the column address information CAn="1" is accessed, the part MWLa<1> of the main word line MWLa is activated by the main row decoder 20A, and the memory cells connected to the sub-word line SWL are used as usual. Similarly, a part MWLc<0> of the main word line MWLc corresponding to the column address information CAn="0" is used as the target of the access. That is, when the address information indicating the part MWLc<0> is input, the main word line MWLc is activated.

Thus, in the present embodiment, when the defective cells are remedied, the parts included in the two main word lines MWL, respectively, can be replaced with one redundant main word lines RMWL. For example, when the one redundant main word line RMWL and the column address information CAn for one bit are used, the freedom degree of the remedy is 2.

In consequence, the number of the defective cells which can be remedied can be increased without involving the increase of the number of necessary redundant word lines, that is, the increase of the number of the redundant cells or the increase of the occupying area of the redundant cell array.

Therefore, even when the column address information is assigned to the plurality of physical regions (blocks) provided in one memory cell array to remedy the defective cell connected to the word line as in the resistive variable semiconductor memory using the hierarchical word line system of the second embodiment, the remedy efficiency of the defective cell can be improved in the same manner as in the first embodiment.

[Modification]

In the first and second embodiments of the present invention, the inner constitution of the memory cell array has been described with respect to the example of the MRAM using the magnetoresistive effect element as the resistance change memory element RM, but the present invention is not limited to this example. For example, the memory cell array 1A may have the constitution of a resistive random access memory (ReRAM) using an element whose resistance value changes by a voltage applying method or the constitution of a phase change random access memory (PCRAM) using an element whose resistance value changes by using the change of a crystal phase.

FIG. 12 is a schematic diagram showing the constitution of a resistance change memory element RM used in an ReRAM. The resistance change memory element RM includes a lower electrode 111, an upper electrode 115 and a recording layer 117 sandwiched between these electrodes 111, 115.

The recording layer 117 is made of a transition metal oxide such as a perovskite type metal oxide or a binary metal oxide. Examples of the perovskite type metal oxide include PCMO ($Pr_{0.7}Ca_{0.3}MnO_3$), Nb-added $SrTi(Zr)O_3$ and Cr-added $SrTi(Zr)O_3$. Examples of the binary metal oxide include NiO, $TiO_2$ and $Cu_2O$.

Examples of the resistance change memory element RM include an element having an operation mode referred to as a bipolar type and an element having an operation mode referred to as a uni-polar type. The resistance value of the bipolar type element RM changes, when changing the polarity of a voltage applied to the element RM. The resistance value of the uni-polar type element RM changes, when changing the absolute value of the voltage applied to the element. Therefore, the resistance change memory element RM is set to a low resistance state and a high resistance state by controlling the applied voltage. Note that the element is of the bipolar type or the uni-polar type depending on the selected material of the recording layer 117.

For example, when the bipolar type resistance change memory element, RM is used, a voltage for changing the resistance change memory element RM from the high resistance state (a reset state) to the low resistance state (a set state) is a set voltage Vset, and a voltage for changing the element from the low resistance state (the set state) to the high resistance state (the reset state) is a reset voltage Vreset.

The set voltage Vset is set to a positive bias for applying a positive voltage to the upper electrode 115 with respect to the lower electrode 111, and the reset voltage Vreset is set to a negative bias for applying a negative voltage to the upper electrode 115 with respect to the lower electrode 111. Moreover, the low resistance state and the high resistance state correspond to "0" data and "1" data, whereby the resistance change memory element RM can store one bit of data.

When the data is read, a sufficiently small reading voltage which is about 1/1000 to 1/4 of the reset voltage Vreset is applied to the resistance change memory element RM. At this time, a current flowing through the resistance change memory element RM can be detected to read the data.

FIG. 13 is a schematic diagram showing a constitution of a resistance change memory element RM used in a PCRAM. The resistance change memory element RM has a constitution in which a lower electrode 111, a heater layer 118, a recording layer 119 and an upper electrode 115 are laminated in order.

The recording layer 119 is made of a phase change material, and is set to a crystalline state and an amorphous state by heat generated during writing. Examples of a material of the recording layer 119 include chalcogen compounds such as Ge—Sb—Te, In—Sb—Te, Ag—In—Sb—Te and Ge—Sn—Te. These materials preferably secure high-speed switching properties, repetitive recording stability and high reliability.

The heater layer 118 comes in contact with the bottom surface of the recording layer 119. The area of the heater layer 118 which comes in contact with the recording layer is preferably smaller than that of the bottom surface of the recording layer 119. This is because a contact portion between the heater layer 118 and the recording layer 119 is made smaller to miniaturize a heating portion, thereby lowering a writing current or voltage. The heater layer 118 is made of a conductive material, and preferably made of, for example, one material selected from the group consisting of TiN, TiAlN, TiBN, TiSiN, TaN, TaAlN, TaBN, TaSiN, WN, WAlN, WBN, WSiN, ZrN, ZrAlN, ZrBN, ZrSiN, MoN, Al, Al—Cu, Al—Cu—Si, WSi, Ti, Ti—W and Cu. Moreover, the heater layer 118 may be made of the same material as that of the lower electrode 111 described later.

The area of the lower electrode 111 is larger than that of the heater layer 118. The upper electrode 115 has, for example, the same planar shape as that of the recording layer 119. Examples of the material of the lower electrode 111 and the upper electrode 115 include high melting point metals such as Ta, Mo and W.

As to the recording layer 119, the size and width of a current pulse applied thereto are controlled to change a heating temperature, and the layer changes to the crystalline state or the amorphous state. Specifically, at the time of the writing, a voltage or a current is applied between the lower electrode 111 and the upper electrode 115, and the current is supplied from the upper electrode 115 to the lower electrode 111 through the recording layer 119 and the heater layer 118. When the recording layer 119 is heated to the vicinity of a melting point thereof, the recording layer 119 changes to an amorphous phase (a high resistance phase), and keeps the amorphous state even when the applying of the voltage or the current is stopped.

On the other hand, when the voltage or the current is applied between the lower electrode 111 and the upper electrode 115 and the recording layer 119 is heated to the vicinity of a temperature suitable for crystallization, the recording layer 119 changes to a crystal phase (a low resistance phase), and keeps the crystalline state even when the applying of the voltage or the current is stopped. When the recording layer 119 is changed to the crystalline state, the size of the current pulse applied to the recording layer 119 is set to a small size, and the width of the current pulse is set to a large width as compared with a case where the recording layer is changed to the amorphous state. Thus, when the voltage or the current is applied between the lower electrode 111 and the upper electrode 115 to heat the recording layer 119, the resistance value of the recording layer 119 can be changed.

It can be judged whether the recording layer 119 has the crystal phase or the amorphous phase, by applying a low voltage or a low current between the lower electrode 111 and the upper electrode 115 to such an extent that the recording layer 119 does not change to the crystalline state or the amorphous state and detecting the voltage or the current between the lower electrode 111 and the upper electrode 115. Therefore, when the low resistance state and the high resistance state correspond to the "0" data and the "1" data, one bit of data can be read from the resistance change memory element RM.

[Others]

In a resistance variable semiconductor memory according to an embodiment of the present invention, needless to say, the combined constitution of the first and second embodiments may be set, that is, a plurality of segments based on column address information may be set in one block. Also in this case, the remedy efficiency of defective cells can be improved.

The resistance variable semiconductor memory according to the embodiment of the present invention is applied to, for example, a random access memory.

Moreover, in the embodiment of the present invention, the memory cell array 1A shown in FIG. 3 uses so-called 1 transistor+1 element memory cells each constituted of one resistance change memory element RM and one selection transistor, but the present invention is not limited to this example. The memory cell array 1A may have, for example, a so-called cross point type inner constitution in which resistance change memory elements are provided in portions where word lines intersect with bit lines, or a so-called 2 transistor+1 element memory cells.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A resistance change memory comprising:
   a memory cell array in which a plurality of memory cells including resistance change memory element are arranged in a matrix manner;
   a plurality of word lines connected to the plurality of memory cells, respectively, and extending in a first direction;
   a row decoder which is disposed near the memory cell array and which activates each of the word lines;

a redundant cell array in which a plurality of redundant cells used instead of defective cells in the memory cell array are arranged;

a redundant word line connected to the plurality of redundant cells, respectively, and extending in the first direction;

a redundant row decoder which is disposed near the redundant cell array and which activates the redundant word line;

a control circuit in which defect address information indicating the word line connected to the defective cell is stored and which remedies the defective cell in a case where input address information matches the defect address information; and at least two regions provided in the memory cell array and the redundant cell array, respectively, logically divided in the first direction, and identified based on column address information;

at least one defect address storage section in the control circuit, which stores the defect address information, the one defect address storage section having two or more storage elements in which the defect address information is stored and which are provided in accordance with the two or more regions, respectively, and having a switch element which is provided in accordance with each of the two or more storage elements and which selectively reads one piece of the defect address information from one of the two or more storage elements based on the column address information, wherein the control circuit replaces a part of the word line connected to the defective cell with a part of the redundant word line in accordance with each of the logically divided regions, and allows the redundant row decoder to activate the replaced redundant word line.

2. The resistance change memory according to claim 1, wherein the part of the word line connected to the defective cell and the replaced redundant word line indicate same column address information.

3. The resistance change memory according to claim 1, wherein the word lines and the redundant word lines have a hierarchical word line system.

4. The resistance change memory according to claim 3, wherein:

the word line includes a plurality of sub-word lines connected to the plurality of memory cells and provided in each of the regions, and a main word line to which the plurality of sub-word lines are connected in common and which is disposed across the two or more regions of the memory cell array, and the redundant word line includes a plurality of redundant sub-word lines connected to the plurality of redundant cells, respectively, and provided in each of the regions, and a redundant main word line to which the plurality of redundant sub-word lines are connected in common and which is disposed across the two or more regions of the redundant cell array.

5. The resistance change memory according to claim 4, wherein the control circuit replaces the part of the main word line connected to the defective cell with the part of the redundant main word line in each of the regions.

6. The resistance change memory according to claim 4, wherein the row decoder has a main row decoder section which activates the main word line and a sub-row decoder which activates the sub-word line, and the redundant row decoder has a redundant main row decoder section which activates the redundant main word line and a redundant sub-row decoder section which activates the redundant sub-word line.

7. The resistance change memory according to claim 6, wherein the sub-row decoder section has driver units provided for the plurality of sub-word lines, respectively, and the sub-word line is connected to the one main word line via the driver unit.

8. The resistance change memory according to claim 1, wherein in the word line connected to the defective cell, a part of the word line disposed in the logically divided region which does not include the defective cell is activated by the row decoder.

9. The resistance change memory according to claim 1, wherein the switch element includes a CMOS inverter, a first transistor connected to one source end of the CMOS inverter, and a second transistor connected to the other source end of the CMOS inverter, the defect address information is input into an input node of the CMOS inverter, and the column address information is input into a gate of the first and second transistor.

10. The resistance change memory according to claim 1, wherein the defect address information storage section has a combining circuit which combines the one selected defect address information and the address information of the selected word line.

11. The resistance change memory according to claim 1, wherein the control circuit includes one or more address comparison sections which compare the input address information with the defect address information.

12. The resistance change memory according to claim 11, wherein the address comparison section has a calculating unit which logically calculates the defect address information output from the defect address information storage section.

13. The resistance change memory according to claim 11, wherein the control circuit includes a remedy judgment section which judges whether or not to remedy the defective cell based on the comparison result of the address comparison section.

14. The resistance change memory according to claim 13, wherein the remedy judgment section has a calculating unit which logically calculates the comparison result of the address comparison section.

15. The resistance change memory according to claim 1, wherein the resistance change memory element stores the data in a nonvolatile manner.

16. The resistance change memory according to claim 1, wherein the resistance change memory element is a magnetoresistive effect element.

17. The resistance change memory according to claim 1, wherein the resistance change memory element has a storage layer whose resistance value changes in accordance with a voltage to be applied thereto.

18. The resistance change memory according to claim 1, wherein the resistance change memory element has a storage layer whose resistance value changes in accordance with the crystalline state thereof.

* * * * *